US007284214B2

(12) United States Patent
LeBritton et al.

(10) Patent No.: US 7,284,214 B2
(45) Date of Patent: Oct. 16, 2007

(54) IN-LINE XOR CHECKING OF MASTER CELLS DURING INTEGRATED CIRCUIT DESIGN RULE CHECKING

(75) Inventors: Joseph Andrew LeBritton, Dripping Springs, TX (US); John G. Ferguson, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 413 days.

(21) Appl. No.: 10/970,727

(22) Filed: Oct. 22, 2004

(65) Prior Publication Data

US 2006/0090146 A1    Apr. 27, 2006

(51) Int. Cl.
*G06F 17/50*      (2006.01)
(52) U.S. Cl. ........................................................ 716/5
(58) Field of Classification Search .................. 716/5
See application file for complete search history.

(56) References Cited

U.S. PATENT DOCUMENTS

| | | | |
|---|---|---|---|
| 6,230,299 B1 | 5/2001 | McSherry et al. | |
| 6,249,903 B1 | 6/2001 | McSherry et al. | |
| 6,301,697 B1 | 10/2001 | Cobb | |
| 6,339,836 B1 | 1/2002 | Eisenhofer et al. | |
| 6,397,372 B1 | 5/2002 | Bozkus et al. | |
| 6,415,421 B2 | 7/2002 | Anderson et al. | |
| 6,425,113 B1 | 7/2002 | Anderson et al. | |
| 6,721,928 B2 * | 4/2004 | Pierrat et al. | 716/4 |
| 6,748,578 B2 | 6/2004 | Cobb | |
| 6,922,823 B2 * | 7/2005 | Tester | 716/10 |

OTHER PUBLICATIONS

Benware et al., "Impact of Multiple-Detect Test Patterns on Product Quality", ITC International Test Conference, Paper 40.1, pp. 1031-1040, 2003.
LeBritton, In-line XOR Checking of Master Cells with Calibre-DRC, AppNote 0345, Feb. 9, 2004.
Internet Printout: http://www.future-fab.com/login.asp?d_ID=1202&login=true&mode=print—Resolution Enhancement with OPC/PSM dated Apr. 30, 2004.
Internet Printout: http://www.xs4all.nl/'kholwerd/interface/bnf/gdsformat.html—GDSII format dated Jul. 15, 2004.

(Continued)

*Primary Examiner*—Jack Chiang
*Assistant Examiner*—Brandon W. Bowers
(74) *Attorney, Agent, or Firm*—Jonathan T. Kaplan

(57) ABSTRACT

Systems and methods for verifying integrated circuit designs: (a) receive input corresponding to physical layouts of cells of the design and available master cells. The systems and methods then determine if the design cells are intended to correspond to one of the master cells, and if so, the systems and methods then determine if the layouts of the cells and the corresponding master cells match one another, e.g., by a layout vs. layout comparison of the design cell with the master cell to determine if the coordinates of the polygon(s) in the design cell match corresponding coordinates of the polygon(s) in the master cell. An "XOR" comparison may be used to determine if the design cell features match the corresponding master cell features. Computer-readable media may be adapted to include computer-executable instructions for performing such methods and operating such systems.

84 Claims, 7 Drawing Sheets

OTHER PUBLICATIONS

Internet Printout: http://www.xs4all.nl/'kholwerd/interface/bnf/example.html—Keyfile output of example GDSII file dated Jul. 15, 2004.

"Standard Verification Rule Format (SVRF) Manual," Mentor Graphics Corporation 2003. 59 pages, numbered: cover page, 1-1 to 1-15, 2-1 to 2-12, 3-1, 3-201 to 3-202, 3-271 to 3-272, 3-303 to 3-306, 3-317 to 3-318, 3-346 to 3-352, 3-364 to 3-366, 3-636 to 3-637, 3-807 to 3-812, 3-877 to 3-878.

"Calibre Verification User's Manual," Mentor Graphics Corporation 2003. 5 pages, numbered: cover page, 4-48 to 4-51.

* cited by examiner

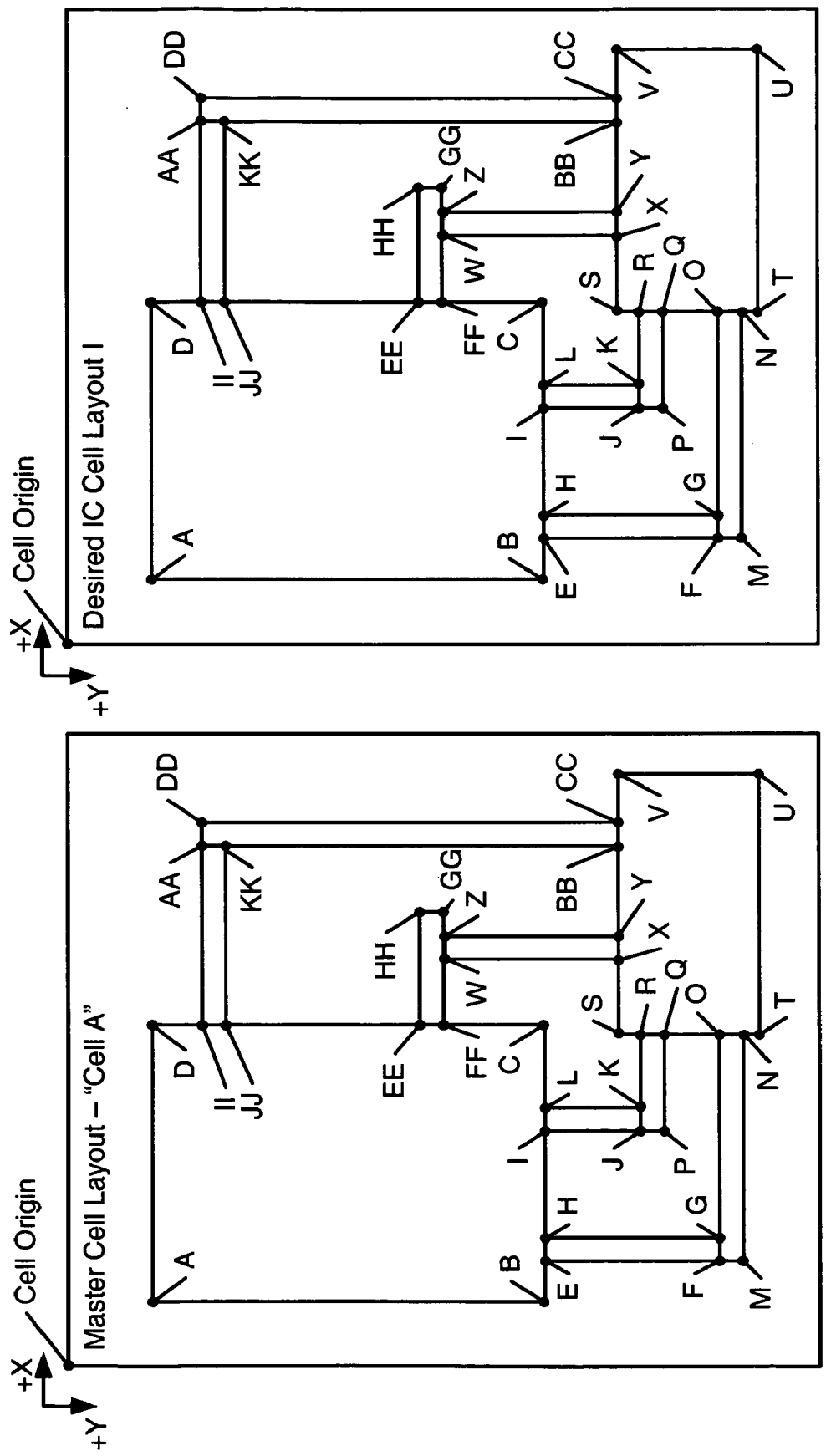

ial layouts, especially for wires that will be used to interconnect
IN-LINE XOR CHECKING OF MASTER CELLS DURING INTEGRATED CIRCUIT DESIGN RULE CHECKING A portion of the disclosure of this patent document contains material that is subject to copyright protection. The copyright owner has no objection to the facsimile reproduction by anyone of the patent document or the patent disclosure, as it appears in the Patent and Trademark Office patent file or records, but it otherwise reserves all copyright rights whatsoever.

FIELD OF THE INVENTION

The invention relates generally to techniques used in verifying the layout of integrated circuit designs. Various aspects of this invention have particular application for facilitating the verification of layouts of integrated circuit designs, such as memory circuit designs, that do not necessarily comply with a predetermined set of design rules applied to the remainder of the circuit design.

BACKGROUND

Microcircuit devices and other integrated circuits ("ICs") are used in a wide variety of products, such as automobiles, microwaves, personal computers, etc. Designing and fabricating such devices typically involves many steps, steps that have become known as a "design flow." The particular steps of a design flow are highly dependent on various factors, such as the type of circuit to be designed, its complexity, the design team's preferences, and the microcircuit fabricator's or foundry's preferences or limitations.

Generally, large scale integrated circuits and other integrated devices typically are designed through a complex sequence of transformations that convert an original performance specification into a specific circuit structure. Automated software tools currently may be used for many of these design transformations. A common high level description of an integrated circuit may be provided in languages such as VHDL and VERILOG® ("VHDL" stands for "very high speed integrated circuit hardware description language;" "VERILOG®" is a registered trademark for Computer Programs for Computer-Aided Engineering Design for Electrical Engineering owned by Gateway Design Automation Corp. of Littleton, Mass.). One embodiment of VHDL is described in greater detail in "IEEE Standard VHDL Language Reference Manual," ANSI Std. 1076-1993, published Jun. 6, 1994. One embodiment of VERILOG® is described in greater detail in "IEEE Standard 1364-1995." These documents are entirely incorporated herein by reference. The description of the integrated circuit at this stage of a design often is called a "net list," and it represents the specific electronic devices of the desired circuit (e.g., transistors, resistors, capacitors, their interconnections, etc.) that will achieve the desired logical result. Preliminary estimates of timing also may be made at this stage, assuming that each device in the desired integrated circuit will have a characteristic speed associated with it. The "netlist" may be considered as corresponding to the level of representation displayed in conventional circuit diagrams.

Once the relationships between the various circuit elements have been established, the design again is transformed, this time into the specific geometric elements that define the exact shapes that will be present to form the individual elements of the circuit. Automated tools exist to convert a "netlist" into a physical layout for the corresponding integrated circuit (e.g., custom layout editors, such as "IC Station" available from Mentor Graphics Corp., or "Virtuoso" available from Cadence Design Systems, Inc.). Automated place and route tools (conventional and commercially available) also can be used to define the physical layouts, especially for wires that will be used to interconnect logical elements of a design. FIG. 1 illustrates one example approach for converting a netlist to a corresponding physical layout. The "layout" defines the specific dimensions of the gates, isolation regions, interconnects, contacts, and other device elements that form the physical devices, and it usually represents these shapes with polygons defining their boundaries.

A layout typically contains data layers that correspond to the actual layers to be fabricated in the circuit (e.g., to be fabricated by a photolithographic process). Layouts also typically contain cells that define sets of particular devices within the circuit. Cells typically contain all the polygons on all the layers required for the fabrication of the devices it contains. Cells may be nested within other cells, often in very intricate arrangements. The structure of cells often is called a "data hierarchy." Typical formats for data representing the polygons of a physical layout include GDS-II, CIF, OASIS, etc.

Once a layout is created, the layout may be verified to insure that the transformation from netlist to layout has been properly executed and that the final layout created adheres to certain geometric "design rules." These two checks often are called an "LVS" (layout versus schematic) check and a "DRC" (design rule check), respectively. To perform this verification, several products have been created, including DRACULA™ (available from Cadence Design Systems, Inc. of San Jose, Calif.), HERCULES™ (available from Avant! Corporation of Fremont, Calif.), and CALIBRE® (available from Mentor Graphics Corporation of Wilsonville, Oreg.). When anomalies or errors are discovered, e.g., elements of a layout too close to one another, etc., the designer must then investigate the error and, if necessary, correct it before the layout is sent to a mask shop for mask manufacturing and wafer fabrication. Failure to correct such errors may result in production of masks that produce circuits having a high incidence of failure (e.g., a high percentage of short circuits, bridging problems, and the like).

An additional checking step also often is used for layout verification. FIG. 2 illustrates an additional approach to conversion of a netlist to a physical layout. This approach provides a simulation based software engine that predicts what manufacturing distortions will occur during lithographic patterning. If the magnitude of these errors is determined to be significant, corrections may be made using some form of "optical proximity correction" ("OPC"). OPC can correct for image distortions, optical proximity effects, photoresist kinetic effects, etch loading distortions, and other various process effects. Phase-shifting features also may be added to the layout at this point to enhance contrast, e.g., using a phase-shift mask ("PSM"). Examples of this type of checking and correction can be found, for example, in C. Spence, et al., "Automated Determination of CAD Layout Failures Through Focus: Experiment and Simulation," *Optical/Laser Microlithography VII, Proceedings of SPIE* 2197 (1994), pp. 302-313, and E. Barouch, et al., "OPTIMASK: An OPC Algorithm for Chrome and Phase-Shift Mask Design," *Optical/Laser Microlithography VIII, Proceedings of SPIE* 2440 (1995), pp. 192-206. These documents are entirely incorporated herein by reference. These techniques include operating on a layout with a series of distinct software tools that execute all the required steps in sequence.

FIG. 3 is a conceptual illustration of an example of processes for integrated circuit design verification and correction. In this illustrated example, each of the process steps is executed by a stand-alone software tool. The original IC layout 300 describes the physical circuit layers from which masks and/or reticles are created to realize the circuit described by a design layout. The original IC layout 300 may be, for example, a GDS-II description of the integrated circuit to be manufactured, or another layout format, like those mentioned above.

Data import process 310 converts the original IC layout 300 to a format for storage in verification database 315. The data, as stored in verification database 315, may be used by a layout versus schematic ("LVS") tool 320 and a design rule checking ("DRC") tool 325 to verify the design of original IC layout 300. Upon completion of LVS and DRC verification, the data stored in verification database 315 is exported by data export process 330.

This data then is imported by data import process 335, which converts the exported data to a format used for a phase shift mask ("PSM") database 340. PSM tool 345 operates on the data stored in PSM database 340 to perform phase shifting where appropriate. Examples of stand alone PSM assignment tools are SEED (discussed in the Barouch article identified above) and the iN-Phase™ product now available from Synopsys, Inc. of Mountain View, Calif. The data describing the phase shifted layout(s) are exported from a PSM database 340 by data export process 350.

Data import process 355 imports the data generated by the PSM tool to an optical proximity correction ("OPC") database 360. The OPC database 360 typically is a flat database, meaning that all the polygons of a layer of the circuit are contained within a single cell, with no hierarchical structure. Data import process 355 typically converts data from a hierarchical representation to a flat representation in the OPC database 360. OPC tool 365 performs OPC operations on the data stored in OPC database 360. Examples of stand alone OPC tools are OPTIMASK, discussed in the above-identified Barouch article, and Taurus™ available from Avant! Corporation of Fremont, Calif. Data export process 370 exports the data stored in OPC database 360.

The data generated by the OPC tool 365 then typically is imported into a simulation tool to confirm that the OPC will have the desired corrective effect. This action is sometimes called an "optical rule check," or "ORC." Once this check is complete, the data may be exported for use in an IC manufacturing process 395. If desired, as a final verification step, LVS tool 320 and/or DRC tool 325 also may be used on the output of OPC database 360. Performing another check with LVS tool 320 and/or DRC tool 325 requires another import and export by data import process 310 and data export process 330, respectively.

Further variations on the systems and methods described above are described in U.S. Pat. No. 6,425,113 to Anderson, et al., which patent is entirely incorporated herein by reference.

Complex "system-on-chip" ("SoC") layouts in integrated circuit designs often are assembled using cells from many sources. Some of the layouts combined into a single SoC contain cells that have been designed with exceptions to the general design rules governing the overall integrated circuit (also called "golden cells" or "master cells" in this specification). For example, memory arrays and/or other memory-containing cells often will have physical layouts with spacings, dimensions, and other features that do not comport with the general constraints or general "design rules" placed on other portions of an IC design, yet these special cells are known to function correctly and are known to be capable of proper layout and manufacture. Typically, these cells will be identified as errors during conventional design rule checks, and these errors will have to be investigated and cleared by the designer and/or IC manufacturer before the mask, chip, or circuit is manufactured. Such investigation and clearance procedures are tedious and time-consuming, particularly when the layout contains many structures corresponding to a master cell.

In some systems and methods, these special cells may be identified and handled as "exceptions" during conventional design rule checking (as described above), and then separate design rule check runs may be required for these exceptional cells. Even in such systems and methods, the requirements for special handling and/or separate design rule checks can become tedious, overly complex, and very time-consuming, particularly when the number of exceptions and exceptional cells becomes large, as is common in many SoC designs.

It is not adequate to merely identify areas in an IC design as corresponding to a "master cell" and stopping the design rule check at that point. For various reasons, an IC designer may change one or more features associated with the "master cell" design in a specific layout (e.g., to enable it to interact with other portions of the IC) thereby changing the master cell design, which can invalidate its status as an approved exception to the conventional design rules. As another example, approved "master cell" designs may change over time, but some designers still may be using older versions of the master cell (e.g., by copying from old designs, by missing recent updates to the master cell design, etc.). These older versions may no longer be pre-approved for use in IC designs. In such instances, merely identifying a "master cell" in a layout may result in the introduction of unapproved and/or erroneous cell structures into an IC design layout. Layouts having such cells may be more prone to failures when finally embodied in a chip.

Accordingly, it would be useful in the art to provide systems and methods that: (a) will allow "in-line" identification and location of cells intended to correspond to previously designated master or golden cells, and/or (b) will allow in-line determination of whether the master cell, as used in the IC layout, actually corresponds to a current and previously approved master cell layout and structure.

SUMMARY

The following presents a general summary of aspects of the invention in order to provide a basic understanding of at least some aspects of the invention. This summary is not an extensive overview of the invention. It is not intended to identify key or critical elements of the invention or to delineate the scope of the invention. The following summary merely presents some concepts of the invention in a general form as a prelude to the more detailed description that follows.

Aspects of this invention relate to systems and methods used in verifying integrated circuit designs. Such systems and methods may include: (a) receiving input including data corresponding to a physical layout of a cell of an integrated circuit design (e.g., in GDS-II format, CIF format, OASIS format, or other "picture" type format), e.g., via a means for receiving such input; (b) receiving input including data corresponding to a physical layout of a master cell (e.g., again in GDS-II format, CIF format, OASIS format, or other "picture" type format), e.g., again via a means for receiving such input; (c) determining if the cell of the integrated circuit design potentially corresponds to the master cell (e.g., using a computer processing system); and (d) when the cell of the integrated circuit is determined to potentially correspond to the master cell, determining if the physical layout of the cell corresponds to the physical layout of the master cell (e.g., again using a computer processing system). In at least some examples, the systems and methods may receive input data corresponding to plural desired layout cell designs and plural master cells, and the systems and methods further may determine which individual master cell, if any, the various layout cell designs potentially correspond, and then determine if the desired design layout indeed corresponds to the identified master cell layout.

Examples of the invention additionally may include generating an output reporting the results of the determination(s) made during performance of the methods, e.g., via an output generating means, such as a printer, a screen display, a computer file, etc. The output result may take on various forms. For example, it may in some manner indicate whether the physical layout of the cell corresponds to the physical layout of the master cell via an ASCII file, a GDS-II file, a CIF file, an OASIS file, or other file or display form or format. Other output forms or formats also are possible without departing from the invention.

Additionally, in systems and methods according to examples of the invention, the process of determining if the physical layout of the cell corresponds to the physical layout of the master cell may take place in a variety of ways. For example, in some instances, this process may include a layout versus layout comparison of the design cell with the master cell. More specifically, in some examples, the process may include comparison of data corresponding to the physical layout of the cell (e.g., data representing coordinates of polygon(s) making up the physical layout of the cell) with corresponding data relating to the physical layout of the master cell (e.g., data representing coordinates of polygon(s) making up the physical layout of the master cell), e.g., to determine if they match, have the same size, have the same relative orientations, etc. Such processes, in at least some examples, may include an "XOR" comparison of plural features of the physical layout of the cell with corresponding plural features of the physical layout of the master cell to determine if the features match.

Example aspects of the invention further may relate to computer-readable media that include computer-executable instructions stored thereon for performing various methods according to the invention and operating various systems according to the invention, including the various systems and methods described above.

BRIEF DESCRIPTION OF THE DRAWINGS

A more complete understanding of the present invention and certain advantages thereof may be acquired by referring to the following description in consideration with the accompanying drawings, in which like reference numbers indicate like features, and wherein:

FIGS. 6A through 6D are illustrative aids that help describe examples of determining whether a desired cell layout corresponds to an approved master cell layout;

DETAILED DESCRIPTION

Figure 1:
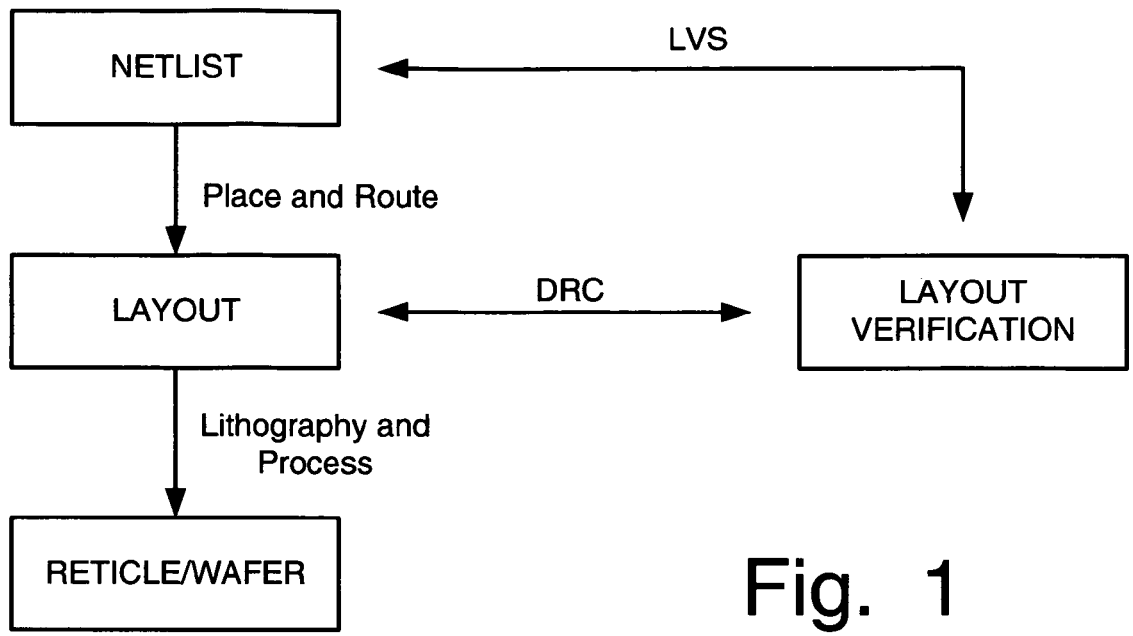
FIG. 1 illustrates a general overview of an integrated circuit layout verification system and method.
Figure 2:
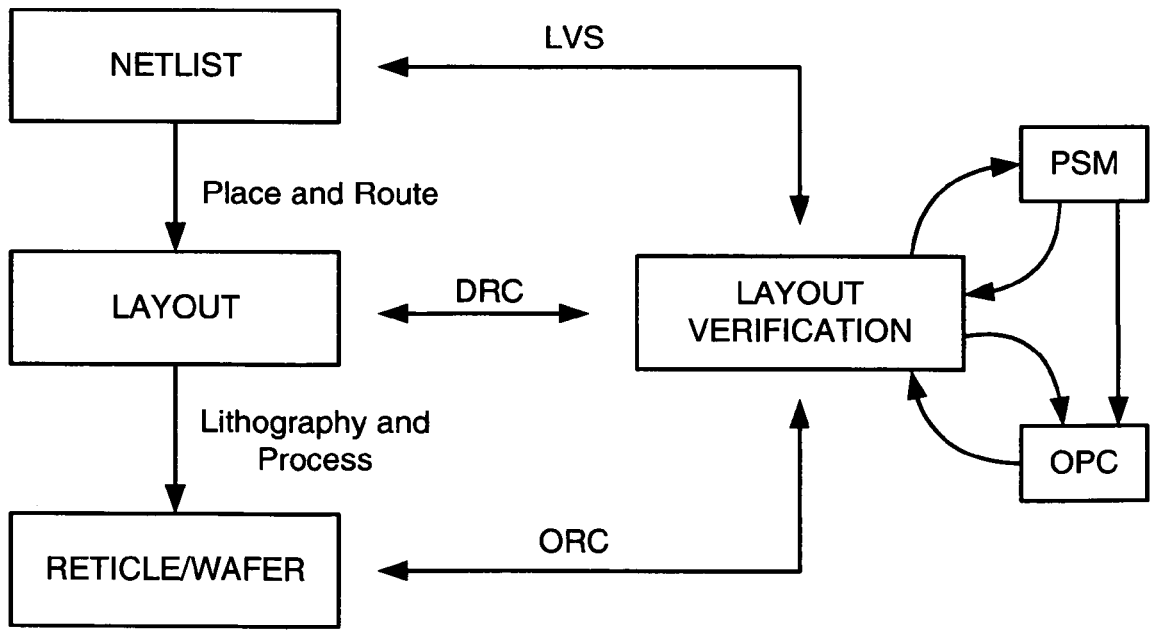
FIG. 2 illustrates a general overview of an integrated circuit layout verification system and method that additionally includes phase-mask shift and optical proximity corrections.
Figure 3:
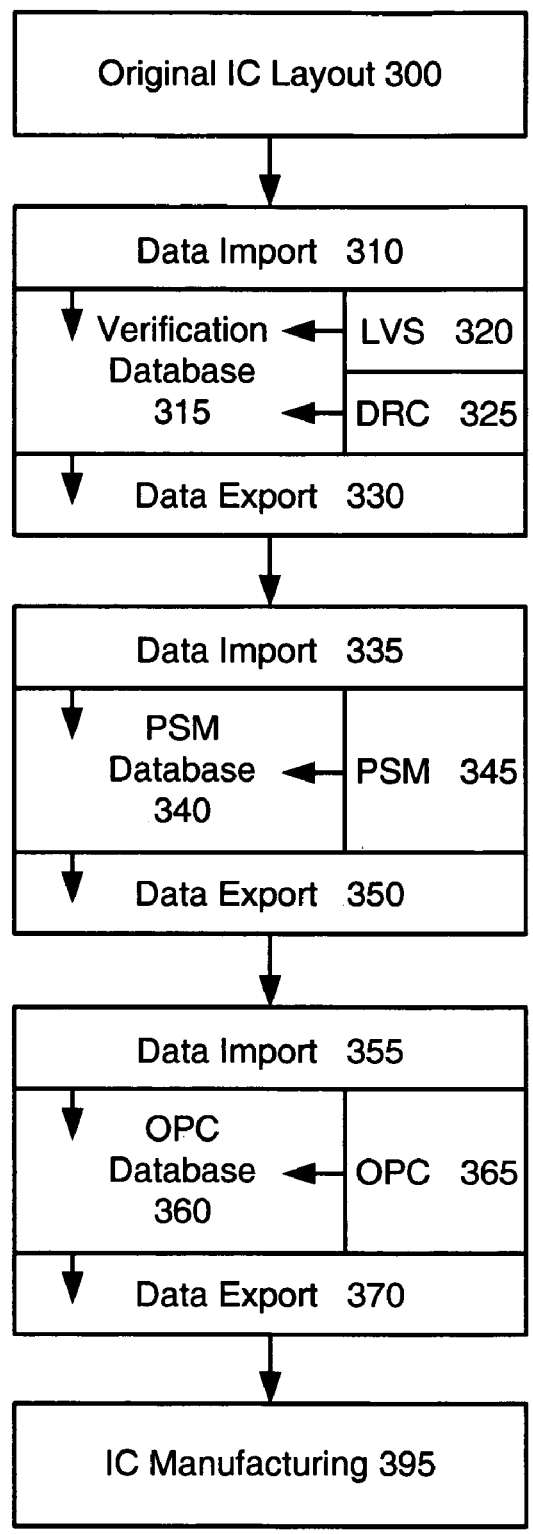
FIG. 3 illustrates an example of a conventional process for moving an integrated circuit design from layout to manufacturing.

In the following description of various example embodiments of the invention, reference is made to the accompanying drawings, which form a part hereof, and in which is shown by way of illustration various example systems and environments in which the invention may be practiced. It is to be understood that other specific arrangements of parts, steps, environments, and the like may be utilized, and structural and functional modifications may be made without departing from the scope of the present invention.

A. General Background

As will be appreciated by those of ordinary skill in the art, the design and structure of modern integrated circuits has become extremely complex. It is not uncommon, for example, for a conventional integrated circuit to have millions of transistors arranged on a substrate, in extremely close proximity to one another, with each transistor having multiple layers of material. Accordingly, it has become very important to verify that an integrated circuit layout is accurate and conforms to desired geometric design rules before constructing photolithographic masks and/or other integrated circuit fabrication tools used in producing that layout.

To this end, as noted above, a number of verification tools have been developed to verify integrated circuit layouts. These tools include, for example, the CALIBRE® product from Mentor Graphics of Wilsonville, Oreg., and the DRACULA® product from Cadence Design Systems of San Jose, Calif. Implementations of such verification tools are described in U.S. Pat. No. 6,230,299 to McSherry, et al.; U.S. Pat. No. 6,249,903 to McSherry, et al.; U.S. Pat. No. 6,339,836 to Eisenhofer, et al.; U.S. Pat. No. 6,397,372 to Bozkus, et al.; U.S. Pat. No. 6,415,421 to Anderson, et al. and U.S. Pat. No. 6,425,113 to Anderson, et al. Each of these patents is entirely incorporated herein by reference.

Because of the complexity of modern integrated circuit layouts, verification tools, such as the CALIBRE® product, typically will process a layout after it has been divided into smaller segments or "cells." The definition and hierarchy of the cells may be based upon a variety of different criteria. For example, the hierarchy of the cells may be arranged based upon the stacking order of individual layers in the desired integrated circuit. Thus, a portion of an integrated circuit layout data for structures that occur in one layer of the integrated circuit may be assigned to a cell in a first hierarchical level, while another portion of the layout data corresponding to structures that occur in a higher layer of the integrated circuit then may be assigned to a second cell in a second hierarchical level different from the first hierarchical level.

Alternately, the hierarchy of a layout may be based upon the combination of individual structures to form larger structures. For example, a portion of an integrated circuit layout corresponding to an electrode contact may be assigned to a cell in a first hierarchical level, while another portion of the layout corresponding to a NAND gate that includes the electrode contact then may be assigned to a cell in a second hierarchical level higher than the first hierarchical level. Still another portion of the layout corresponding to a larger circuit structure employing a plurality of the NAND gates then may be assigned to a cell in a third hierarchical level higher than the second hierarchical level.

Thus, an integrated circuit layout typically will be verified on a cell-by-cell basis, to ensure that each cell complies with previously designated design rules (e.g., to assure that the spacings, dimensions, and other physical characteristics of the cell comply with predetermined standards, which increases the likelihood that the layout can be physically manufactured using existing manufacturing techniques and/ or under existing manufacturing tolerances without producing an excessive number of failures). As previously noted, however, in some circumstances, a layout will intentionally include cells that do not comply with the predetermined design rules. For example, for an integrated circuit including a memory structure in addition to other structures, cells related to the memory structure often may contain layouts with exceptions to the design rules otherwise used for the other structures of the integrated circuit. Systems and methods according to various examples of the present invention will allow users to easily and efficiently identify these exceptions and confirm that the cells containing these "exceptions" match a previously approved "master cell" design without requiring a user to revise the design rule set or to execute separate design rule check runs.

B. General Description of Integrated Circuit Design Verification Methods and Systems According to the Invention In general, aspects of this invention relate to systems and methods used in verifying integrated circuit designs. One more specific aspect of the invention relates to methods that may include: (a) receiving input including data corresponding to a physical layout of a desired cell of an integrated circuit design (e.g., in GDS-II format, CIF format, OASIS format, or other "picture" type format); (b) receiving input including data corresponding to a physical layout of a master cell (e.g., again in GDS-II format, CIF format, OASIS format, or other "picture" type format); (c) determining if the desired cell of the integrated circuit design is intended to correspond to the master cell; and (d) when the desired cell of the integrated circuit design is determined to potentially correspond to the master cell design, determining if the physical layout of the cell corresponds to the physical layout of the master cell. In at least some examples, the methods may include receipt of input data corresponding to plural layout cell designs and plural master cells, and the method further may include determining which individual master cell, if any, the various layout cell designs are intended to correspond.

Additional example aspects of the invention relate to generating an output reporting the results of the determination(s) made during performance of the methods. For example, methods according to examples of the invention further may include outputting a result indicating whether the physical layout of the desired cell corresponds to the physical layout of the master cell. This output may take on a variety of different forms. For example, the output may constitute an ASCII file that identifies any determined differences between the physical layout of the desired cell as compared to the physical layout of the master cell or a GDS-II (or other format) file that contains data identifying one or more portions of the physical layout of the desired cell that differs from the physical layout of the master cell. Other output forms or formats also are possible without departing from the invention.

In example methods according to the invention, the process of determining if the physical layout of the desired cell corresponds to the physical layout of the master cell may take place in a variety of ways. For example, in some instances, this process may include a layout versus layout comparison of the desired design cell with the master cell. More specifically, in some examples, the process may include comparison of data corresponding to the physical layout of the desired cell (e.g., data representing coordinates of polygon(s) making up the physical layout of the cell) with corresponding data relating to the physical layout of the master cell (e.g., data representing coordinates of polygon(s) making up the physical layout of the master cell), e.g., to determine if they match, have the same size, have the same relative orientations, etc. Such processes, in at least some examples, may include an "XOR" comparison of plural features of the physical layout of the cell with corresponding plural features of the physical layout of the master cell to determine if the features match.

Once a determination is made as to whether the desired design cell structure matches the corresponding master cell structure, any desired or suitable action may be taken. For example, for cells found to not correspond to the master cell design, an output may be generated indicating this fact, the cell could be subjected to the design rule check procedures applied to the remainder of the circuit, etc. Additionally, while cells found to correspond to a master cell design may not require any additional design rule checks with respect to the cell structure, systems and methods according to examples of the invention may take other actions with respect to those cells. For example, rule checks may be performed with respect to the interactions or locations of interactions of the desired cell with other features or elements of the circuit (if any), e.g., its interactions with elements external to the cell may be checked. Additionally or alternatively, if desired, an output may be generated noting the location and/or master cell structure of the approved desired cell. Any other suitable or desired outputs and/or actions may be generated without departing from the invention.

Additional aspects of the invention relate to systems used in verifying integrated circuit designs, including systems that may perform various integrated circuit design verifying methods, including the methods described above. One more specific aspect of the invention relates to systems that may include: (a) means for receiving input including: (i) data corresponding to a physical layout of a desired cell of an integrated circuit design, and (ii) data corresponding to a physical layout of a master cell; and (b) a processor system for determining if the desired cell of the integrated circuit design potentially corresponds to the master cell, wherein when the desired cell of the integrated circuit design is determined to potentially correspond to the master cell design, the processor system further determines if the physical layout of the desired cell corresponds to the physical layout of the master cell. Of course, in at least some examples, the means for receiving input may receive input corresponding to plural cells in the integrated circuit design and plural master cells. Additionally, in such systems, the processor system may determine whether each of the desired design cell layouts potentially corresponds to one of the individual master cells, and if so, whether its layout indeed does correspond to the identified master cell.

Systems according to examples of the invention further may include means for outputting a result indicating whether the physical layout of the desired cell corresponds to the physical layout of the master cell. This may be accomplished, for example, using a computer display screen, generating a computer file, printing an output, and/or by other output methods, including use of conventional output methods known in the art. As noted above, the output may take on a variety of different forms, such as an ASCII file, a GDS-II file, CIF file, OASIS file, or other format, as described above.

Additionally, processor systems used in systems according to examples of the invention may determine if the physical layout of the desired design cell corresponds to the physical layout of the master cell in a variety of ways. For example, in some instances, the processor system may perform a layout versus layout comparison of the design cell with the master cell. More specifically, in some examples, the processor system may compare data corresponding to the physical layout of the desired cell (e.g. data representing coordinates of polygon(s) making up the physical layout of the cell) with corresponding data relating to the physical layout of the master cell (e.g., data representing coordinates of polygon(s) making up the physical layout of the master cell), e.g., to determine if the polygon coordinates match, have the same size, have the same relative orientations, etc. Such processor systems, in at least some examples, may perform an "XOR" comparison of plural features of the physical layout of the desired cell with corresponding plural features of the physical layout of the master cell to determine if the features match.

It may be necessary, in at least some examples, to compare the physical layout of the desired cell with the physical layout of the master cell(s) in a variety of ways to determine if they match. For example, a master cell may have a variety of different orientations when placed in a final desired design layout. Therefore, to determine if the desired design corresponds to the master cell design, it may be necessary to compare the desired design against the master cell design at various different orientations from a given origin point (e.g., in a first orientation, rotated 90° from the first orientation (e.g., clockwise), rotated −90° from the first orientation (e.g., counterclockwise), rotated 180° from the first orientation, in a mirrored orientation, or the like). By checking the desired design against the master cell design in various potential orientations, the system can look for the master layout in the final desired design in a variety of different orientations.

Many variations on the example systems and methods according to the invention may be provided without departing from the invention. For example, in addition to and/or as an alternative to determining if the polygon data of a desired layout matches the polygon data of a master cell, other data may be considered and compared. For example, any data available in a layout database may be considered and compared between a desired layout and a master layout without departing from the invention, such as hierarchy data, cell data, cell instances data, textual data, text attribute data, layer property and/or attribute data, cell property and/or attribute data, and the like.

Aspects of the invention further relate to computer-readable media that include computer-executable instructions stored thereon for performing various methods according to the invention and operating various systems according to the invention, including the various systems and methods specifically described above.

Specific examples of the invention are described in more detail below. The reader should understand that these specific examples are set forth merely to illustrate examples of the invention, and they should not be construed as limiting the invention.

C. Specific Examples of the Invention

The various figures in this application illustrate examples of integrated circuit design verification systems and methods useful in accordance with aspects of the present invention.

Figure 4:
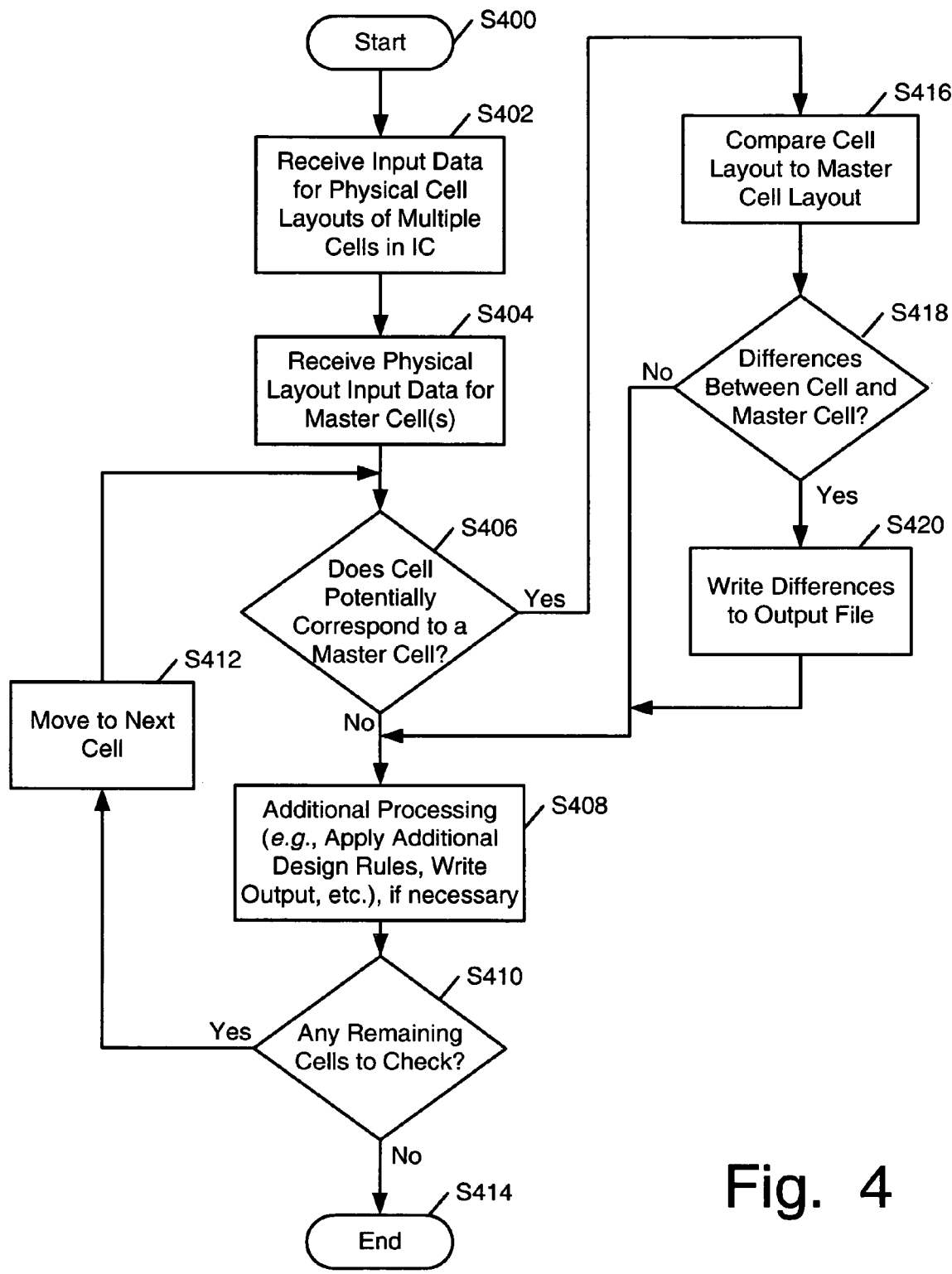
FIG. 4 illustrates example systems and methods useful in accordance with examples of the invention for determining whether a desired cell layout design corresponds to an approved master cell layout design.

FIG. 4 illustrates a flow diagram that generally relates to a first example method that may be used in accordance with aspects of this invention. As this example procedure starts (S400), systems and methods in accordance with examples of this invention receive access to and/or actually receive input data corresponding to the physical layout of a desired integrated circuit design (S402). This input data, in at least some instances, may be provided in the form of "polygons" that make up the desired integrated circuit structure. As examples, this input data representing the physical cell layouts may be in a conventional format, such as GDS-II, CIF, OASIS, and the like. The polygons may define one or more layers of materials (e.g., metal layers, semiconductor layers, insulator layers, etc.) that make up the desired integrated circuit design, including, for example, polygons that define the shapes, sizes, and orientations of transistors, resistors, capacitors, conductor paths, and other circuit elements. As mentioned above, plural electronic elements (e.g., transistors, resistors, capacitors, conductor paths, and other circuit elements) may be grouped together in a design layout to form a "cell." The cell layout data for the desired design may come from any suitable source, such as from the layout designer, a design library, an external network source, etc. Additionally or alternatively, in at least some examples, data other than polygon data may be stored as part of the layout data. For example, layout data may include data relating to: hierarchy, cell information, cell instances, text, text attributes, layer properties, layer attributes, cell properties, cell attributes, etc. Any data of this type may be considered and compared as some or all of the data corresponding to a physical layout of a cell and/or data corresponding to a physical layout of a master cell.

Turning briefly to FIG. 6B, this figure illustrates a simplified conceptual example of a "layout" of a desired cell of an integrated circuit design that is made up of a series of polygons. The polygons correspond to the locations of elements in the design layout, such as transistors, resistors, capacitors, conductors, wires, etc. This example cell layout comprises two polygons that make up "devices" (namely, Polygon (A,B,C,D) and Polygon (S,T,U,V)), and eight polygons that make up "conductor paths" between the devices (namely Polygons (E,F,G,H), (I,J,K,L), (F,M,N,O), (J,P,Q, R), (W,X,Y,Z), (AA,BB,CC,DD), (EE,FF,GG,HH), and (II, JJ,KK,AA)). Each of the "polygons" of the cell may be defined by the coordinate points (as measured from the "cell origin") that make up its corners, and the data corresponding to the cell may be made up of data corresponding to the coordinate points that make up all of the polygons in the cell. Of course, cells may contain polygons of shapes other than rectangles without departing from the invention, including polygons of multiple sizes, polygons having round or curved edges, etc. Additionally, a typical integrated circuit cell may contain several thousand or even millions of polygons, optionally in multiple layers, without departing from the invention.

Returning to the process of FIG. 4, in a next process step (S404), systems and methods according to this example of the invention may receive access to and/or actual input relating the physical layout of one or more "master" cells that may be used in the desired layout design. The master cell layout data may be obtained from any suitable source, such as from a library of master cells maintained by the designer, by a manufacturer or fabricator, etc. As described above, while not a requirement, master cells may include various polygon layouts and/or other features (such as dimensions, device locations, contact locations, and the like) that do not comply with design rules applied to the remainder of the IC layout. Nonetheless, because of its pre-approved status, a designer will know that the design of the master cell will function appropriately and is capable of being manufactured by a fabricator despite its failure to comply with certain of the design rules applicable to the remainder of the circuit. As one example, memory-containing cells typically will have dimensions and/or other characteristics that do not comply with design rules generally applied to other portions of an integrated circuit design. However, because such memory-containing cells typically have been used repeatedly (both over time and/or in individual integrated circuit designs), manufacturers have come to be able to reliably manufacture these memory-containing cells despite the fact that their dimensions may not fully comply with the general circuit's design rules. Individual fabricators may have libraries of pre-approved master cells for various functions (e.g., memory cells) that they know (from past use and experience) that they are capable of manufacturing to an acceptable detect-free level. FIG. 6A illustrates a conceptual view of a "master cell" polygon layout that may correspond to the cell layout described above in conjunction with FIG. 6B.

In at least some examples of the invention, the master cell library may be encrypted, available as a "read-only" database, and/or otherwise protected to prevent users from making inadvertent or otherwise unauthorized changes to the approved master cell structures. For example, one form of the layout data may be as ASCII text including the coordinate data representing where the polygons or other structures are placed in the layout. This textual data, particularly for the master cells, may be encrypted. Encryption prevents others from altering or changing the original master cell data, e.g., to match their desired cell data, in order to get a clean DRC run. Encrypting the master cell text data keeps this data uneditable by unauthorized users.

Once the desired integrated circuit cell layouts and master cell layouts have been received by (or otherwise made available to) systems and methods according to this example of the invention, the systems and methods next determine whether the individual cells of the design are intended to (or potentially) correspond to one of the master cells, e.g., from the master cell library (S406). This step can take place in a variety of different ways. For example, in some instances a designer will store the cell in the desired layout using a name that is the same as or similar to the name of the master cell (e.g., "Memory_Cell_A" in the desired layout corresponds to "Memory_Cell_A" or "Memory_Cell_A.Master" in the master cell library). In such instances, systems and methods according to examples of the invention may look at the desired layout cell's name and determine which master cell, if any, it appears to most closely relate.

As another example, the cell layout storage format for both the master cell layouts and the desired cell layouts may contain some general identifying data relating to the content of the cell. For example, data associated with the master cell layout structure shown in FIG. 6A may indicate that the overall cell contains ten total polygons, or even more specifically, two polygons associated with devices and eight polygons associated with conductor paths. Likewise, data associated with the desired cell layout structure shown in FIG. 6B also may indicate that the cell contains ten total polygons, or even more specifically, two polygons associated with devices and eight polygons associated with conductor paths. By simply comparing this general data associated with the two cells, systems and methods according to at least some examples of the invention could quickly determine whether the desired cell layout has any probability of corresponding to the master cell layout (e.g., if the desired layout contains two polygons associated with devices and eight polygons associated with conductor paths (ten total polygons), this layout clearly would not correspond to a master cell having polygons associated with 12 devices and 250 conductor paths (262 total polygons)). When applied to more conventional and complex integrated circuit cell structures (e.g., those having thousands or millions of polygons), matches (or near matches) of the numbers of polygons in the desired and master cell layouts may provide a relatively reliable indicator of whether the desired cell potentially corresponds to the master cell. Systems and methods according to at least some examples of the invention may determine if a desired cell matches a master cell whenever the number(s) of polygons in the stored cells match or nearly match (e.g., within 10%, 5%, 2%, 1%, etc.).

Other ways of determining whether the desired cell layout potentially corresponds to one (or more) of the master cell layouts may be used without departing from the invention. For example, the presence or location of one or more elements in the desired layout (e.g., one or more polygons) may be quickly checked to determine if the master cell contains these corresponding element(s), optionally at the desired location. As another potential option, the number of layers at one or more locations in the cell structures may be compared to determine if these numbers match. Any desired way of determining whether the desired cell layout potentially corresponds to one of the master cell layouts may be used without departing from the invention.

If it is determined that the desired cell layout does not potentially correspond to any of the master cells (branch "No" at S406 in FIG. 4), systems and methods according to this example of the invention then may perform any necessary or desired additional processing with respect to the cell (S408). For example, because the desired cell under consideration was not found to correspond to one of the master cells, systems and methods according to this example of the invention may apply the general design rules to this cell (as used on the remainder of the design) and determine whether the cell complies with those rules (generating any desired or necessary outputs, as is conventional based on this conventional design rule check). After any desired processing is completed, systems and methods according to this example of the invention next determine if there are any additional cells in the desired design that need to be checked (and/or optionally if any additional processing needs to be completed) (S410). If Yes, the procedure moves to the next cell (S412), and returns to S406 to repeat the processing for the next cell of the desired layout. If no cells remain to be checked (and/or no other processing needs to be performed)—the "No" branch at S410 in the procedure of FIG. 4, the process ends (S414) (and/or optionally moves on to other processing).

In some instances, a designer may begin using an approved master cell layout and/or think he/she has used an approved master cell layout, but for some reason, the structure or layout used by the designer may not exactly correspond to the approved master cell structure. For example, in some instances a designer may not have used the most recent version of an approved master cell from the master cell library (e.g., copied and pasted a master cell from a previous design, the master cell was changed after a previous version was inserted into the design, a new fabricator was selected, a fabricator changed its procedures or standards, etc.). Such instances may result in the introduction of an old and/or no longer approved design into a desired integrated circuit structure. In other instances, a designer may decide to change an approved master cell's structure for some reason, e.g., to better fit, match, or otherwise work with other portions of the integrated circuit design. Accordingly, once systems and methods according to this example of the invention determine that a desired cell layout potentially corresponds to a master cell layout, the systems and methods further determine whether the desired cell structure indeed actually corresponds to the master cell structure as stored in the approved library.

Therefore, if, at S406, it is determined that the desired design cell layout potentially corresponds to one (or more) of the master cell layouts (the "Yes" branch), the systems and methods according to this example of the invention will then make a more detailed comparison of the desired cell layout against the master cell layout (S416). More detailed examples of this comparison will be described below in conjunction with FIGS. 6A through 6D. If it is determined that there are no differences between the desired cell layout and the approved master cell design (branch "No" at S418), any suitable or desired additional processing may take place (e.g., systems and methods according to the invention may advise the user of this fact by generating an output, interaction areas of the cell with other portions of the IC design may be checked against various rules, etc.), and the process may move to S408 (or to another processing step, if desired). If it is determined at S418 that there are no differences between the desired cell structure and an approved master cell structure, in at least some examples of systems and methods according to the invention, the system and/or method will automatically know that it is not necessary to apply the full design rule check to and/or run any other design rule checks on the desired cell, thus saving substantial processing time (particularly for circuit and cell designs containing thousands or millions of circuit elements). For example, if a memory cell matches its master cell representation, systems and methods according to at least some examples of the invention will not check the design against the logic rules and/or run other design rule checks because this design is known to be approved and/or manufacturable, even if the design would not pass or comply with the standard design rules.

If, at S418, it is determined that the desired design cell structure does not match any master cell structure (branch "Yes"), then systems and methods according to this example of the invention may take any appropriate or desired action. For example, information regarding the determined differences between the design cell and the master cell may be written to an output file (S420) or the user may be otherwise informed of these differences. As another example, the procedure could return to S408 and, because the desired cell does not correspond to a previously approved design, the systems and methods may perform the standard design rule checks on the cell to see if it complies with those rules (and simply continue processing this cell in the conventional manner). Any other suitable or desired processing may take place as a result of determining that the desired design cell structure does not match the approved master cell structure without departing from the invention.

Figure 5:
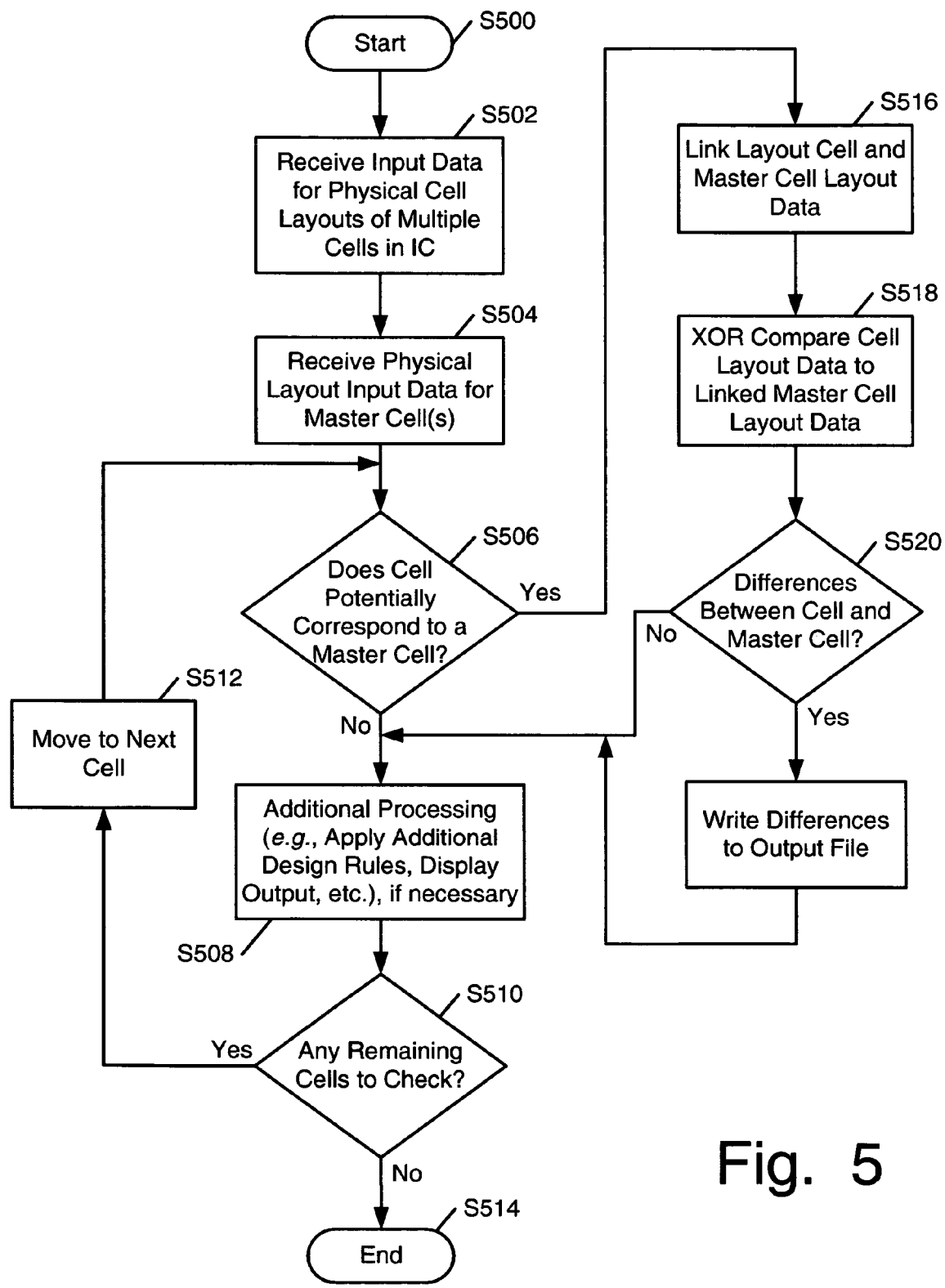
FIG. 5 illustrates additional example systems and methods useful in accordance with examples of the invention for determining whether a desired cell layout design corresponds to an approved master cell layout design.

FIG. 5 illustrates another example of a procedure that may be used by systems and methods according to at least some examples of this invention. As the example procedure of FIG. 5 starts (S500), systems and methods according to this example of this invention again will receive access to and/or actual input data corresponding to the physical layouts of the desired integrated circuit design cell(s) (S502) and the master cell(s) (S504). The input data may be provided in any form or format, including in the same forms and/or formats and/or by the same methods as described above in conjunction with FIGS. 4, 6A, and 6B.

Once the desired integrated circuit cell layouts and master cell layouts have been received by and/or otherwise made available to systems and methods according to this example of the invention, the systems and methods next determine whether the individual cell structures of the design are intended to (or potentially) correspond to one (or more) of the master cell structures, e.g., from the master cell library (S506). This step can take place in a variety of different ways, including in the ways described above in conjunction with FIG. 4.

If it is determined that the desired cell layout does not potentially correspond to at least one master cell structure (branch "No" at S506 in FIG. 5), systems and methods according to this example of the invention then may perform any necessary or desired additional processing with respect to the cell (S508), e.g., such as the processing described above in conjunction with the systems and methods of FIG. 4. After any desired processing is completed, the systems and methods according to this example of the invention determine if there are any additional cells in the desired design that need to be checked (and/or optionally if any additional processing needs to be completed) (S510). If Yes, the procedure moves to the next cell (S512), and then returns to Step S506 to repeat the processing for the next cell of the desired layout. If no cells remain to be checked (and/or no other processing needs-to be performed)—i.e., the "No" branch at S510 in the procedure of FIG. 5, the process ends (S514) (and/or optionally moves on to other processing).

As described above, in instances where a desired design layout potentially corresponds to a master cell layout, systems and methods according to this example of the invention then determine whether the design layout structure actually matches the master cell structure, e.g., the current master cell structure stored in the approved master cell library.

Therefore, if, at S506, it is determined that the desired design cell structure potentially corresponds to one (or more) of the master cells (the "Yes" branch), the systems and methods according to this example of the invention then will make a more detailed comparison of the desired cell layout against the master cell layout. In this example, the layout cell data structure and the master cell data structure are "linked" or concatenated to one another (S516). Any suitable or desired linking arrangement or mechanism may be used without departing from the invention, including conventional arrangements and/or mechanisms known in the art.

To determine if the desired design layout corresponds to the master cell layout, the coordinates of the polygons making up the desired design layout may be compared with the coordinates of the polygons making up the master cell layout using an "XOR" comparison procedure (S518). Examples of this type of comparison will be described in more detail below in conjunction with FIGS. 6A through 6D. If it is determined that there are no differences between the desired cell layout and the approved master cell design (branch "No" at S520), any suitable or desired processing may take place. (e.g., systems and methods according to the invention may advise the user of this fact by generating an output, the desired cell's interactions with other portions of the circuit design may be checked, etc.), and the system may return to S508 (or to another processing step, if desired). If it is determined at S520 that there are no differences between the desired cell structure and an approved master cell structure, it is not necessary to apply the full design rule check to the desired cell, thus saving substantial processing time (particularly for circuit and cell designs containing thousands or millions of circuit elements).

If, at S520, it is determined that the desired design cell structure does not match any master cell structure (branch "Yes"), then systems and methods according to this example of the invention may take any appropriate or desired action. For example, information regarding the differences between the design cell structure and the master cell structure may be written to an output file (S522) or the user may be otherwise informed of these differences (e.g., on a display, printout, etc.) As another example, the procedure could return to S508 and, because the desired cell layout does not correspond to a previously approved design, the systems and methods according to this example may perform the standard design rule checks on the cell to see if it complies with those rules. Any other suitable or desired processing may take place as a result of determining that the desired design cell structure does not match the approved master cell structure without departing from the invention.

Rather than perform the iterative procedures on each cell as described in conjunction with the systems and methods of FIGS. 4 and 5, systems and methods according to at least some examples of the invention could simply begin running their design rule check on the desired layout, and as the rule checks proceed, whenever the system or method runs into a desired design cell that potentially corresponds to a master cell, it could store data relating to the cell to a separate file or memory location (optionally along with the linked data or other information identifying the potential master cell), and at an appropriate time a determination may be made as to whether the desired design cell structures in the file or memory location match the corresponding master cell structures linked to them, for all cells saved in the separate file or memory location. Other ways of processing the data may be used without departing from the invention.

Figure 6D:
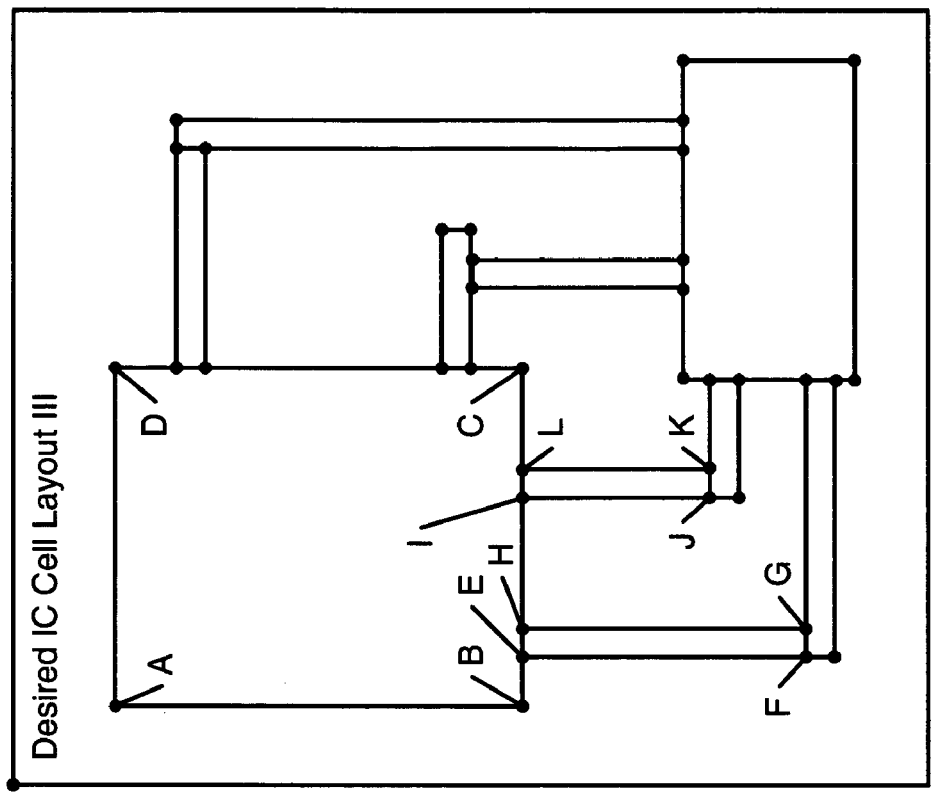

FIGS. 6A through 6D are illustrative aids that help describe examples of comparisons that may take place in systems and methods according to at least some examples of the invention. FIG. 6A represents a master cell layout (named "Cell A") that includes ten total polygons, namely two polygons that make up "devices" (namely, Polygon (A,B,C,D) and Polygon (S,T,U,V)), and eight polygons that make up "conductor paths" between the devices (namely Polygons (E,F,G,H), (I,J,K,L), (F,M,N,O), (J,P,Q,R), (W,X, Y,Z), (AA,BB,CC,DD), (EE,FF,GG,HH), and (II,JJ,KK, AA)). The data relating to this master cell may be stored as a series of XY coordinate points with respect to a cell origin point that make up each of the polygons contained in the structure. For example, for Master Cell A, the stored data may generally take a form as follows:

| | Top Left Coordinate | Bottom Left Coordinate | Bottom Right Coordinate | Top Right Coordinate |
|---|---|---|---|---|
| Polygon ABCD | (50, 50) | (50, 300) | (200, 300) | (200, 50) |
| Polygon EFGH | (75, 300) | (75, 400) | (85, 400) | (85, 300) |
| Polygon IJKL | (160, 300) | (160, 350) | (170, 350) | (170, 300) |
| Polygon FMNO | (75, 400) | (75, 410) | (295, 410) | (295, 400) |
| Polygon JPQR | (160, 350) | (160, 360) | (295, 360) | (295, 350) |
| Polygon STUV | (295, 340) | (295, 415) | (360, 415) | (360, 340) |
| Polygon WXYZ | (250, 230) | (250, 340) | (260, 340) | (260, 230) |
| Polygon AABBCCDD | (280, 90) | (280, 340) | (290, 340) | (290, 90) |
| Polygon EEFFGGHH | (200, 220) | (200, 230) | (270, 230) | (270, 220) |
| Polygon IIJJKKAA | (200, 90) | (200, 100) | (280, 100) | (280, 90) |

Additionally, if desired, the master cell data structure (as well as the desired cell's data structure) may store additional data relating to the cell's structure and/or content. For example, the master cell structure may store data indicating that the cell contains ten total polygons, or even that the cell contains two device polygons and eight conductor path polygons. The cell data structure further may indicate the type of material making up the polygon (e.g., metal, conductor, semi-conductor, insulator, gold, copper, silver, etc.), the number of layers in the polygon, the number of rows and/or columns in an array of the cell, cell orientation data, etc. In at least some examples of the invention, the master cell data will be stored in a conventional format for polygons of a physical layout, such as in a GDS-II, CIF, or OASIS format, etc.

Many different types, formats, and/or other data or information may be stored corresponding to the physical layout of a master cell (or design cell) without departing from the invention. For example, each polygon could be stored as the coordinate points making up a path around the polygon regardless of its shape (i.e., rectangular shaped polygons are not required). For example, a polygon corresponding to path EFMNOGHE may be stored as the coordinate points making up points EMNOGH (point F is superfluous to this more complex polygon because it simply lies on the straight line between points E and M). The polygon edges also need not lie on a vertical or horizontal line; rather, systems and methods according to examples of the invention may assume that the polygons are formed by straight lines between coordinate points as one moves around the polygon regardless of the direction between points (e.g., starting at the top left coordinate and moving counterclockwise around the polygon shape, in the example above). "Polygons," in at least some examples, also may be defined as having round or curved shapes or edges without departing from the invention (e.g., stored as a center point and radius, radius of curvature, etc.). Any suitable or desired convention for storing the polygon data may be used without departing from the invention, including conventions used in known formats like the GDS-II, CIF, and OASIS formats mentioned above.

FIG. 6B illustrates an example cell layout that a user has included in a desired integrated circuit design (called "Desired IC Cell Layout I"). The physical cell layout data form and format used for the desired integrated circuit design may be the same as the form and format used for the master cell physical layout data, e.g., a GDS-II format, CIF format, OASIS format, and the like. Notably, the physical cell layout illustrated in FIG. 6B appears similar to that of the master cell of FIG. 6A. Indeed, the cell of FIG. 6B includes ten total polygons, including two device polygons and eight conductor path polygons, just like the master cell of FIG. 6B. Accordingly, in the example systems and methods described above in conjunction with FIGS. 4 and 5, the systems and methods would identify the desired layout device cell of FIG. 6B as potentially corresponding to Master Cell A of FIG. 6A, e.g., because this desired device cell contains the same number of device and conductor path polygons and/or the same total number of polygons as Master Cell A. As noted above, any suitable or desired manner of determining whether the desired layout cell potentially corresponds to one or more of the master cell layouts may be used without departing from the invention.

Because the desired cell layout in this example is determined to potentially correspond to a master cell structure (i.e., Master Cell A) systems and methods according to this example of the invention then check to determine if the desired layout cell structure actually corresponds to the master cell structure. This can be accomplished in various ways without departing from the invention. For example, systems and methods according to at least some examples of the invention may check the coordinate points associated with each polygon in the two layouts. If all of the coordinate points of the desired cell layout match the coordinate points of the master cell layout, and if every coordinate point in the desired cell layout has a corresponding coordinate point in the master cell layout, the systems and methods according to this example of the invention can then confirm that the desired cell layout exactly matches the master cell layout. In such a case, if the master cell structure has been pre-approved (e.g., despite any areas that do not comply with the design rules applied to the remainder of the integrated circuit design), the desired design layout also can be approved without the need to complete the conventional design rule checking procedure (and without generating the errors that would turn up as a result of this conventional design rule checking procedure in the areas of the cell design that do not comply with the applied design rules). If desired, other processing still may be run on the cell, such as processing to confirm that the areas in which the cell interacts with other portions of the circuit conform to certain design rules, etc.

If, however, for any reason, the desired design layout does not match the master cell layout (e.g., because the designer changed the design, the designer used an old design of the master cell, the accepted master cell structure was changed after the previous structure was inserted into the present design, the fabricator's specifications changed, the fabricator was changed, etc.), the polygon coordinate check will locate differences in the coordinates associated with the desired layout and the master cell, it will locate additional polygons, and/or it will locate other errors or differences. This situation can be handled in any suitable or desired manner without departing from the invention. For example, the existence, location, and/or other details relating to the differences or errors may be stored and/or provided to the user in any appropriate manner (e.g., via a print out, on a computer display, stored on a computer-readable medium, etc.). Additionally or alternatively, the desired cell structure then could be subjected to the normal or conventional design rule checks as applied to the remainder of the circuit design, and any errors that turn up in those checks (if any) could be reported to the user in a conventional manner. Other ways of handling this situation also are possible without departing from the invention.

One way of performing the polygon coordinate check involves use of an "exclusive OR" ("XOR") comparison procedure. XOR is a conventional Boolean logic function that can be used to determine if two inputs are equivalent to one another. As is known, a conventional XOR device will accept (at least) two logical inputs, like inputs A and B shown in FIG. 7. The "truth table" associated with an XOR device is as follows:

| Input A | Input B | Output XOR |
|---------|---------|------------|
| 0 | 0 | 0 |
| 0 | 1 | 1 |
| 1 | 0 | 1 |
| 1 | 1 | 0 |

Therefore, an XOR device produces a high output (or produces an output) only when one input value differs from the other input value (i.e., when A≠B). If both input values are the same (i.e., if A=B) the XOR device produces a low output (or no output).

Figure 7:
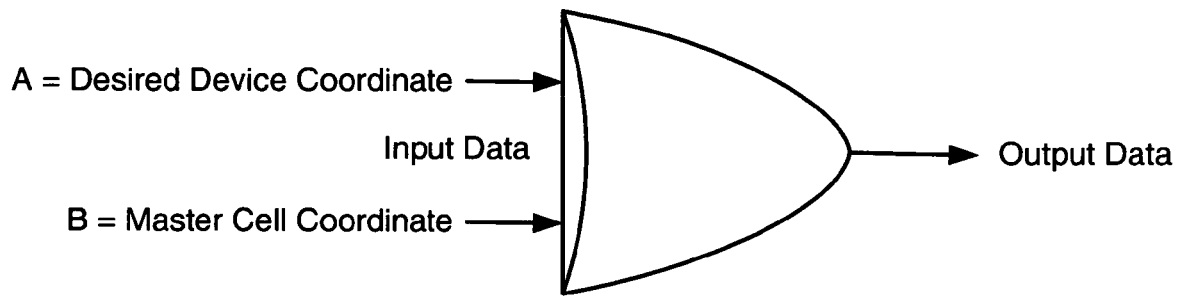
FIG. 7 illustrates an example XOR gate that may be used in accordance with examples of the invention for determining whether a desired cell layout corresponds to an approved master cell layout.

Accordingly, an XOR comparison device may be used in systems and methods according to the invention to determine whether the coordinates of the polygons in a desired design layout (e.g., input A in FIG. 7) exactly match the coordinates of the polygons in a master cell layout (e.g., input B in FIG. 7). For example, as described above, systems and methods according to at least some examples of the invention initially will determine that the desired cell layout of FIG. 6B potentially corresponds to the layout of Master Cell A of FIG. 6A. To finally determine if the cell layouts are the same, the coordinates corresponding to the various polygons in the layouts may be compared using an XOR comparative device, e.g., like that described above. For example, the cell of FIG. 6B includes the first device polygon ABCD, and the stored coordinates of that polygon in this example (based on the cell origin) would be A=(50, 50), B=(50,300), C=(200,300), and D=(200,50). Likewise, because they have the same structure in this example, polygon ABCD of Master Cell A also would have the coordinates A=(50,50), B=(50,300), C=(200,300), and D=(200,50). On a computer system or in computer-readable media, these coordinate points would be stored as a binary word (e.g., a 16, 24, or 32 bit word).

In the above example, when the coordinate values for point A for each of the desired layout and the master cell layout are fed as inputs to an XOR comparison device (as a binary word), the XOR's output would be 0 (or low) because the coordinate values are the same in this example. Likewise, the XOR device would produce no output (or a low output) when the coordinates for points B, C, and D of polygon ABCD (and all of the remaining coordinate points for all of the remaining polygons in the structure) are compared because in this example, the desired cell layout exactly corresponds to the master cell layout. Accordingly, when the XOR comparison device produces no output (or a low output), the user will know that the inputs to the XOR device matched exactly at all times, and therefore, that the coordinates of the polygons matched exactly at all times (and thus that the structures are identical). If any coordinate value in the desired cell structure does not exactly match a corresponding coordinate of the master cell structure, the XOR inputs will differ (i.e., the binary words corresponding to the input coordinates will differ at some location(s)), and the XOR comparison device will produce an output (or will produce a high output). The user may be advised of these differences and/or their locations in any suitable or desired manner, e.g., as described above.

Figure 6C:
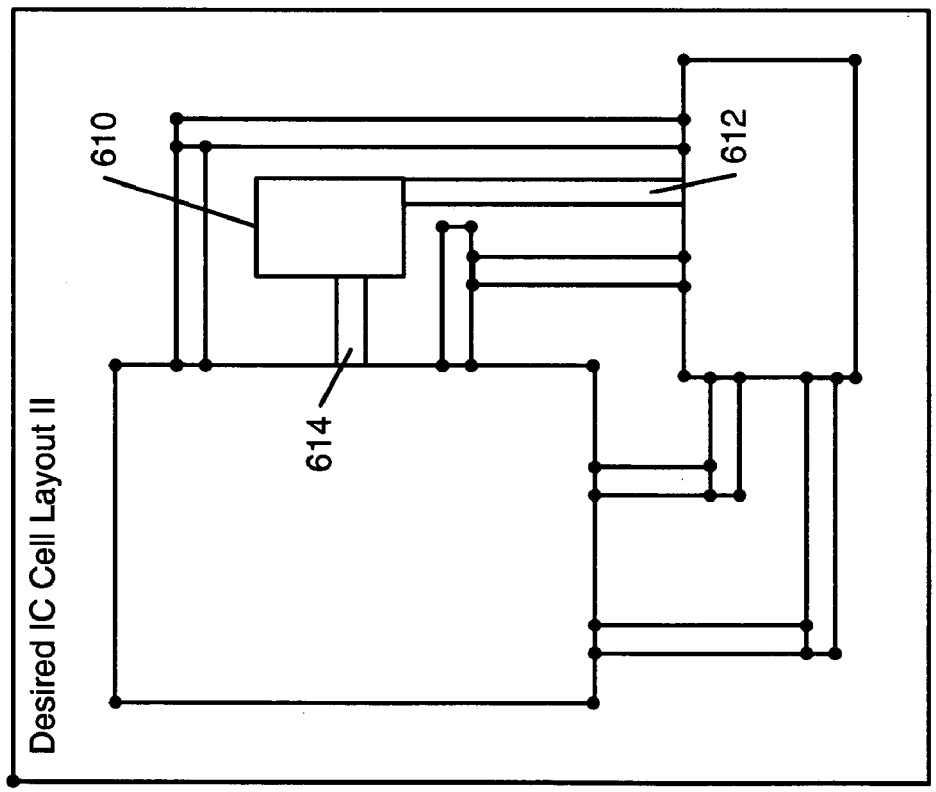

FIG. 6C illustrates another example desired integrated circuit cell layout that may be included in a proposed integrated circuit cell design (called "Desired IC Cell Layout II"). In this instance, the desired cell layout includes all of the polygons included in Master Cell A, plus one extra device polygon 610 and two additional conductor path polygons 612 and 614 as compared to Master Cell A's layout (as shown in FIG. 6A). Accordingly, systems and methods according to examples of the invention may determine that this desired integrated circuit cell layout does not correspond to Master Cell A's layout in one of at least two ways. For example, general data associated with the proposed design of FIG. 6C may indicate that the cell contains three device polygons and ten conductor path polygons, for a total of thirteen polygons. If this general data were compared with corresponding general data stored for Master Cell A (e.g., ten total polygons made up of two device polygons and eight conductor path polygons), the systems and methods may quickly determine that the desired layout structure of FIG. 6C does not potentially match the structure of Master Cell A.

In other examples, systems and methods according to the invention may determine that the structure of FIG. 6C potentially may correspond to the structure of Master Cell A (e.g., if the initial determination was based on common cell name, the presence and/or location of one or more key features in each structure (e.g., polygon ABCD), overall similarity of polygon numbers, etc.). In such a case, the coordinate positions of the layout of FIG. 6C will be compared with the coordinate positions of the layout of Master Cell A (FIG. 6A), e.g., using an XOR comparison device as described above. While the coordinate positions would exactly match for the polygons that exist in each structure in this example, this XOR comparison procedure will note that the polygons of device 610 and conductor paths 612 and 614 have no corresponding polygons in the master cell structure of FIG. 6A. This difference in the cell structures may be brought to the user's attention in any suitable or desired manner, and/or systems and methods according to the invention may handle this situation in any suitable or desired manner, e.g., by subjecting the cell layout to the regular design rule check procedure and/or other processing, etc.

FIG. 6D illustrates another example layout that may be included in a design for an integrated circuit (called "Desired IC Cell Layout III"). In this example, the desired cell has the same general layout as Master Cell A (FIG. 6A), specifically, both structures have ten total polygons comprised of two device polygons and eight conductor polygons. Accordingly, systems and methods according to examples of the invention may identify the cell layout structure of FIG. 6D as potentially corresponding to the layout structure of Master Cell A.

The polygon coordinates in the structure of FIG. 6D, however, differ somewhat from the polygon coordinates of Master Cell A. For example, the cells each have device polygons ABCD, but the coordinates of these polygons do not match exactly, as shown in the table below:

| Coordinate Points | Master Cell A | Cell Layout III |
|---|---|---|
| A | (50, 50) | (50, 50) |
| B | (50, 300) | (50, 260) |

-continued

| Coordinate Points | Master Cell A | Cell Layout III |
|---|---|---|
| C | (200, 300) | (200, 260) |
| D | (200, 50) | (200, 50) |

Similarly, the coordinates of polygons EFGH and IJKL do not exactly match in the structures of FIGS. 6A and 6D (i.e., in the illustrated examples, the locations of points E, H, I, and L differ somewhat in the two structures). Accordingly, when the XOR comparison check is run on these coordinates, the XOR comparison device will produce an output for these polygons, thereby indicating differences between the two structures at the various coordinate points associated with these polygons as noted above.

As will be appreciated by those skilled in the art, a determination of whether a desired integrated circuit cell layout structure corresponds to and exactly matches a master cell's layout structure may be accomplished using electronic circuitry, such as solid state circuitry. Various examples and aspects of the invention, however, may be implemented using computer-executable instructions, such as software program modules, executed by programmable computing devices. Because these examples and aspects of the invention may be implemented using software, the components and operation of a typical programmable computer system on which such examples and aspects of the invention may be employed will be described. More particularly, the components and operation of a programmable computer will be described with reference to FIG. 8. This operating environment is only one example of a suitable operating environment, however, and it is not intended to suggest any limitation as to the scope of use or functionality of the invention.

Figure 8:
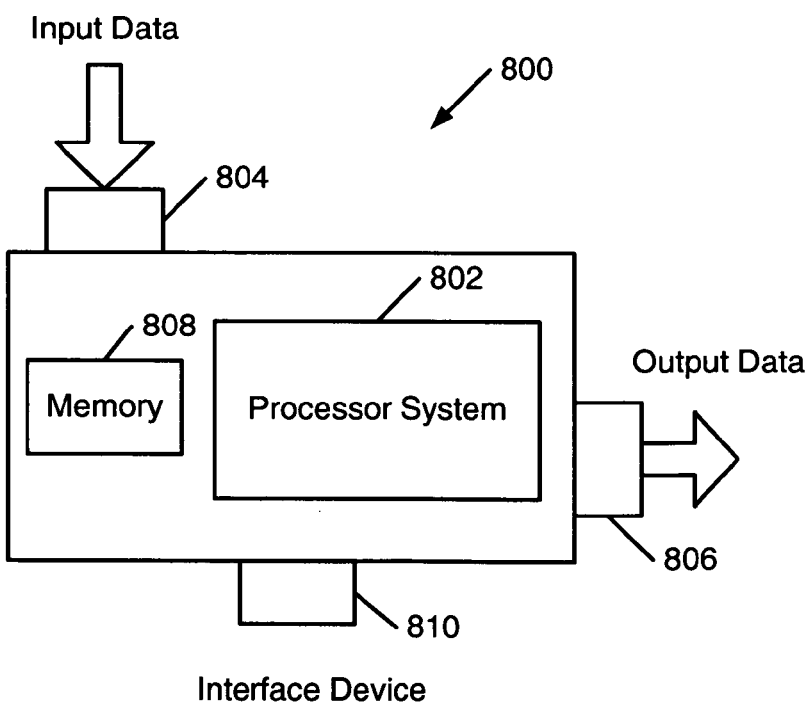
FIG. 8 illustrates an example of hardware systems that may be used for practicing aspects of the invention.

In FIG. 8, the computer system 800 has a programmable processor system 802, such as one or more microprocessors implemented on an integrated circuit. The computer 800 also may have one or more input devices 804 and/or output devices 806, as well as a memory 808. The input devices 804 and output devices 806 may include any devices for receiving input data and/or providing output data, including conventional devices known in the art. As some more specific examples, the input devices 804 may include, for example, keyboards, microphones, scanners, network connections, readable disk drives, and/or pointing devices for receiving input from a user or another source. Examples of suitable output devices 806 may include display monitors, speakers, printers, tactile feedback devices, network connections, and writeable disk drives. These devices and systems, and their connections are well known in the art, and thus will not be discussed at length here.

The memory 808 similarly may be implemented using any combination of computer-readable media that can be accessed, either directly or indirectly, by the processor system 802. The computer-readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD) or other optical storage devices. The computer-readable media also may include magnetic cassettes, magnetic tapes, magnetic disks or other magnetic storage devices, punched media, holographic storage devices, or any other medium that can be used to store desired information.

In at least some examples of the invention, the computer 800 also may include one or more interface devices 810 for exchanging data with other computers. The interface device(s) 810 may include, for example, modems, wired network cards, wireless network cards, and/or any other suitable device(s) for communicating with one or more remote computers. Each of the processor system 802, the input devices 804, the output devices 806, the memory 808, and the user interface device 810 may be interconnected using a data bus, as is conventional and known in the art. As will be appreciated by those skilled in the art, the data bus may by implemented using any type of suitable bus structure, including conventional structures known in the art.

While the above description generally describes finding an exact "match" between the master cell layout and a desired device cell layout, those skilled in the art will appreciate, however, that if desired, any level of tolerance may be used in the system, without departing from the invention. For example, if desired, desired polygon layouts that fall within certain predetermined distance tolerance ranges of the master cell layout may be considered as "matching" the master cell layout, if desired, without departing from this invention.

D. Example "CALIBRE®-Based" Implementations of Aspects of the Invention

One specific example of this invention operates in combination with a design verification tool known as CALIBRE®, available from Mentor Graphics Corporation of Wilsonville, Oreg. As mentioned above (and as used through the remainder of this specification), CALIBRE® is a registered trademark for a design verification system commercially available from Mentor Graphics Corporation of Wilsonville, Oreg.

1. Introduction

A "layout-versus-layout" ("LVL") comparison of two integrated circuit layouts has always been an integral part of integrated circuit computer-aided design ("IC CAD") methodology. One goal of LVL comparisons is to detect the "differences" between two layouts, often by performing a Boolean "exclusive-or" operation ("XOR") between the corresponding layers of the two layout databases. This type of design check is available through CALIBRE®'s dual database capability. An LVL comparison using XOR Boolean may be used to verify that a particular layout cell exactly matches a master or "golden" version of the cell. For an exact match to be verified, the XOR operation is applied to the corresponding polygon layers of the two cells being compared. If no polygons are created for any of the XOR operations between any of the layers, the two cells are "XOR clean," and thus match exactly.

As part of a design rule checking (DRC) process for a full circuit design, it often is desirable to verify that the "golden cells" contained in the design have not been modified in any way. The integrity of these golden cells can be verified by performing an LVL XOR check versus a master (known to be correct) copy of the cell contained in a separate layout database.

In at least some examples, CALIBRE®'s dual database capability may be used in this situation to make the desired XOR checks. Such checks, however, may require a separate run of CALIBRE®-DRC for each of the golden cells in question.

In at least some examples of the invention, the XOR check may be performed in an "in-line" manner (e.g., the user need not write the cells out to disk separately (e.g., to a GDS file) and then run a separate XOR check on them).

One goal of an "in-line" XOR check is to perform the cell-level LVL as part of the DRC run on the entire design. This action removes the need for separate DRC runs to check the golden cells' integrity, and perhaps more importantly, it allows the full chip DRC to perform various checks based on whether the golden cells match (or do not match) the master copy. For example, the DRC may decide to exclude certain checks within the cells only if they exactly match the master copies.

2. Creating the Cell Structure

CALIBRE® allows an in-line XOR check for an arbitrary number of golden cells through its existing ability to read multiple layout databases. The master versions of the golden cells may be placed in an internal CALIBRE® database along with the full chip design. However, this action does place certain restrictions on the structure of the master cells, e.g., in order for the XOR check to work effectively.

For example, consider a layout that contains one or more instances of a cell named "cella." During verification of an integrated circuit design containing "cella," layout data relating to "cella" may be placed in a layout database named "circuit1.gds". In this example, the golden copy of "cella" exists in a separate layout database (e.g., in a library of golden cells) named "goldenlib.gds". A first step in this example method according to the invention is to read both databases into CALIBRE® by specifying both of their pathnames in the LAYOUT PATH statement of the Standard Verification Rule Format ("SVRF") rules file. This may be accomplished, for example, using the following statement:

LAYOUT PATH "/designs/circuit1.gds" "/libs/goldenlib.gds"

By default, CALIBRE® will read in the data for "cella" from the file "circuit1.gds," but it will report an error when it encounters another cell named "celia" in the second file "goldenlib.gds." It is possible, however, to override this default behavior by including the following statement in the SVRF rules file:

LAYOUT ALLOW DUPLICATE CELL YES

This option will cause CALIBRE® to concatenate the two sets of data for "cella" and read them both into the same cell structure. In this manner, the data from the golden cell then will be placed automatically at the same locations, with the same rotations and reflections, as all of the instances of its corresponding cell in the circuit database.

It often may be the case that the master copy of the cell will have a different cell name than the corresponding cell in the full layout database of the integrated circuit. In this situation, the "golden" cell can be renamed on input, so that its data still will be concatenated with the cell data placed on the layout. For example, if in the above example the master copy of "cella" in the golden cell library database is named "cella_golden", the following SVRF statement may be used:

LAYOUT RENAME CELL cella_golden cella

In order for LVS XOR operations to be performed, advantageously, in this example implementation, the master copy of the golden cell will meet the following requirements:

1. The master copy will have the same cell origin location as the cell placed in the full design.
2. The layers in the master copy that are to be compared will occur on different layer/datatype pairs than those in the full design.

Requirement No. 1 above ensures that the polygons of the two cells properly overlay each other for the XOR check. Requirement No. 2 above keeps the corresponding layers separated within the database, so that the XOR operation (or any other SVRF operation) can be reliably performed.

Satisfying Requirement No. 2 above can be problematic in instances where the cell in the full design uses the same layer/datatype pairs as the master copy. One solution to this difficulty is to prepare a master library of the golden cells with different layer/datatype pairs specifically for use in the in-line XOR check. Alternatively, the master's layer/datatype numbers can be modified and written into a temporary layout database with a separate batch run of CALIBRE®-DRC or CALIBRE®-DRV as part of the overall flow.

3. Performing the XOR Check

Once the master copy of the golden cell has been read from the golden cell library in to the CALIBRE® database, the XOR comparison then may be performed. In this example implementation, the XOR comparison can be performed once at the cell level to guarantee the golden cell itself, as used in the design layout, exactly matches the master copy from the golden cell library. The following example illustrates an XOR check of the first metal layer within the cell "cella" (in this example, the metal layer exists on layer number 5 in both databases, but with different datatypes (0 and 1)):

```
LAYER    MAP 5 DATATYPE 0 5000
LAYER    chip_metal1 5000
LAYER    MAP 5 DATATYPE 1 5001
LAYER    gold_metal1 5001
chip_met1_cella = chip_metal1 INSIDE CELL cella
gold_met1_cella = gold_metal1 INSIDE CELL cella
diff_met1_cella = chip_met1_cella XOR gold_met1_cella
cella_gold_metal1_diff  {
    @ metal1 in cella does not match the master copy
    COPY diff_met1_cella  }
```

After running the XOR comparison as described in the above example, any cell level differences for first metal between the golden cell and its master version are displayed by the rule check "cella_gold_metal1_diff".

Alternatively, in at least some examples, it may be possible and/or desirable to perform an "in-place" XOR operation between the golden cell and the master. This may be desirable, for example, if there is an added goal of detecting any polygons from the rest of the chip design's hierarchy that may overlap the golden cell. In such a case, every placement of the golden cell should undergo the XOR check. All regions where the golden cell is placed can be defined with the SVRF "EXTENT CELL" statement, for example, as described below:

```
cella_regions = EXTENT CELL cella
chip_m1_cella = chip_metal1 AND cella_regions
gold_m1_cella = gold_metal1 AND cella_regions
diff_met1_cella_placed = chip_m1_cella XOR gold_m1_cella
```

Differences detected for all placements, including "interactions" from the rest of the design, are formed in the layer "diff_met1_cella_placed".

The results of the XOR check can then be applied within the full DRC run for a variety of purposes. For example, it is possible to create DRC "exclusion zones" (regions where certain checks are not performed) from the result of the in-place XOR check. For example, the SVRF statement:

```
drc_excl=cella_regions    NOT    ENCLOSE
    diff_met1_cella_placed
``` will form polygons enclosing regions where the golden cell and master cell matched.

4. Conclusion of Example "CALIBRE®-Based" Implementations

CALIBRE®'s ability to read in and concatenate multiple integrated circuit layout databases allows for "in-line" XOR checking of database cells versus master copies of those cells. The checks can be performed in various ways and at various levels in the design, such as at the cell level or as "in-place" check at full chip level. The output from XOR checking can be used in a variety of different ways. For example, verification of golden cells as part of the DRC of a full design allows other checks to be contingent on the golden cells matching the master.

E. Other Potential Applications for Aspects of the Invention

While the above description relates to use of aspects of the invention for design rule checking purposes in a layout versus layout analysis, those skilled in the art will appreciate that the invention is not limited to such uses. For example, aspects of the invention also may be useful in layout versus schematic ("LVS") applications and environments.

For example, aspects of the invention may be useful in LVS applications and environments for device definition and extraction purposes. In conventional systems today, a user specifies, in the form of a rule, what layout polygons and configurations represent an active IC device (e.g., MOS transistors, bipolars, resistors, etc.). Often, designers (e.g., analog or RF designers) will have very complex devices that do not follow traditional patterns. As a result, they typically must write special, user-defined, device extraction statements. This can be very difficult. In addition, once a device is recognized, it also can be very difficult to measure the specific device parameters desired for use when comparing the device to the original netlist, or for as a device parameter when running a circuit simulation. Aspects of the invention, however, may be used to create, instead of a rule, a GDS representation (or other "picture" type representation, as described above) of the device in the form of a "master" or "golden device." Using the same approach as described above for master or golden cell DRC, CALIBRE® (available from Mentor Graphics Corp. of Wilsonville, Oreg.) or other design verification systems may identify those structures that match this master device. When the system finds these structures, it would know that these structures constitute a device and not part of the IC interconnect, and as a result, it could extract a netlist, representing the layout, including these difficult devices, properly. In addition, because in this case the devices would all have the exact same dimensions, the user could hard-code the parameters of the device. If desired, the user may wish to allow some tolerance between the actual device structure and the master device structure in this application and environment such that there does not have to be precise matching to identify the actual device structure as corresponding to master device structure.

Aspects of the invention also may be used in LVS applications and environments, for example, for identifying hierarchical correspondence points (e.g., known in the CALIBRE® design verification system (available from Mentor Graphics Corp. of Wilsonville, Oreg.) as "hcells"). These cells tell the CALIBRE® design verification system which structures in the layout have a matching structure in the original schematic hierarchy, thereby allowing faster LVS compare performance. Often, however, it is difficult for a user to identify these structures, especially if there are many-to-one or one-to-many correspondences. In accordance with aspects of the invention, however, instead of listing out the "hcells," a user may instead match a "master" or "golden cell" representation of a layout structure to a schematic cell name. Then, using methods like those described above, the CALIBRE® (or other design verification system) could find the layout cells that match this cell structure, and output their cell names, thus recreating the hcell list.

The above merely describe additional potential example applications and environments for potential use of aspects of the invention. Those skilled in the art will appreciate, however, that aspects of the invention may be applied in other applications and/or environments as well.

F. Conclusion

While specific processes and structures in accordance with the invention are described in detail above, those skilled in the art will appreciate that these descriptions merely constitute examples of processes and structures in accordance with this invention. The skilled artisan will appreciate that the various structures, process steps, process conditions, and the like may vary widely without departing from the invention. Additionally, the skilled artisan will appreciate that variations in the process steps also may occur without departing from the invention. For example, specific steps described above may be omitted, changed, changed in order, and the like without departing from the invention. Also, additional steps may be included between the various steps described above without departing from aspects of this invention. Thus, the spirit and scope of the invention should be construed broadly as set forth in the appended claims.

We claim:

1. A method, comprising:
   receiving input including data corresponding to an integrated circuit design that contains a physical layout of a cell;
   receiving input including data corresponding to a physical layout of a master cell;
   determining a result that indicates if the physical layout of the cell corresponds to the physical layout of the master cell;
   determining, with the result, when to apply a first design rule to the cell; and
   generating a first output indicative of an application of at least one design rule to the integrated circuit design.

2. A method according to claim 1, further comprising:
   determining if the cell potentially corresponds to the master cell; and
   determining the result when the cell is determined to potentially correspond to the master cell.

3. A method according to claim 1, wherein the result is output as a file that identifies determined differences, if any, between the physical layout of the cell as compared to the physical layout of the master cell.

4. A method according to claim 3, wherein the file contains data identifying one or more portions of the physical layout of the cell that differ from the physical layout of the master cell.

5. A method according to claim 2, wherein determining potential correspondence comprises:
   determining a probability of the cell corresponding to the master cell; and
   determining there is a potential correspondence when the probability is sufficient.

6. A method according to claim 5, wherein sufficient probability is any probability.

7. A method according to claim 5, wherein the probability is determined with a test that uses a count of a number of polygons in the cell and a count of a number of polygons master cell.

8. A method according to claim 5, wherein the probability is determined with a test that determines if a first polygon is present in the cell and a second polygon is present in the master cell.

9. A method according to claim 5, wherein the probability is determined with a test that determines if a first polygon is present in the cell at a first location and a second polygon is present in the master cell at a second location.

10. A method according to claim 5, wherein the probability is determined with a test that determines if a first number of layers is present in the cell at a first location and a second number of layers is present in the master cell at a second location.

11. A method according to claim 1, wherein determining the result includes a layout versus layout comparison of the cell and the master cell.

12. A method according to claim 1, wherein the data corresponding to the physical layout of the cell includes data representing coordinates of at least one polygon making up the physical layout of the cell.

13. A method according to claim 12, wherein the data corresponding to the physical layout of the master cell includes data representing coordinates of at least one polygon making up the physical layout of the master cell.

14. A method according to claim 13, wherein determining the result includes a comparison of coordinates in the physical layout of the cell with coordinates in the physical layout of the master cell.

15. A method according to claim 14, wherein the comparison determines if the coordinates match.

16. A method according to claim 15, wherein the comparison includes an XOR comparison of the coordinates.

17. A method according to claim 1, wherein determining the result includes an XOR comparison of plural features of the physical layout of the cell with corresponding plural features of the physical layout of the master cell.

18. A method according to claim 1, wherein the data corresponding to the physical layout of the cell and the data corresponding to the physical layout of the master cell are in a GDS-II format.

19. A method according to claim 1, further comprising:
   generating an output that indicates a difference has been detected when the result indicates that the physical layout of the cell does not correspond to the physical layout of the master cell.

20. A method according to claim 19, wherein the output indicates a location where the physical layout of the cell differs from the physical layout of the master cell.

21. A method according to claim 20, wherein the output includes a GDS-II file that contains data identifying one or more portions of the physical layout of the cell that differs from the physical layout of the master cell.

22. A method according to claim 19, wherein the output includes a file that identifies the difference between the physical layout of the cell as compared to the physical layout of the master cell.

23. A method according to claim 1, further comprising:
applying the first design rule to the cell when the result indicates that the physical layout of the cell does not correspond to the physical layout of the master cell.

24. A method according to claim 23, further comprising:
applying a second design rule to the cell when the result indicates that the physical layout of the cell does correspond to the physical layout of the master cell.

25. A method according to claim 1, further comprising:
applying the first design rule to the cell when the result indicates that the physical layout of the cell does correspond to the physical layout of the master cell.

26. A computer program embodied in a computer readable medium, the computer readable medium embodying the computer program with computer-readable devices, the computer program comprising:
computer readable program code for receiving input including data corresponding to an integrated circuit design that contains a physical layout of a cell;
computer readable program code for receiving input including data corresponding to a physical layout of a master cell;
computer readable program code for determining a result that indicates if the physical layout of the cell corresponds to the physical layout of the master cell;
computer readable program code for determining, with the result, when to apply a first design rule to the cell; and
computer readable program code for generating a first output indicative of an application of at least one design rule to the integrated circuit design.

27. A method, comprising:
receiving input including data corresponding to an integrated circuit design that contains physical layouts of plural cells;
receiving input including data corresponding to physical layouts of plural master cells;
for each of a first plurality of the plural cells of the integrated circuit design, determining a result that indicates if the cell has a physical layout that corresponds to a physical layout of one of the master cells;
determining, with each result, when to apply a design rule to each of the first plurality of cells; and
generating a first output indicative of an application of at least one design rule to the integrated circuit design.

28. A method according to claim 27, further comprising:
determining if a first cell, of the first plurality of the cells, potentially corresponds to a first master cell of the plural master cells; and
determining the result, for the first cell, when the first cell is determined to potentially correspond to the first master cell.

29. A method according to claim 28, wherein the result, for the first cell, is output as a file that includes identification of determined differences between the physical layout of the first cell as compared to the physical layout of the first master cell.

30. A method according to claim 29, wherein the file contains data identifying one or more portions of the physical layout of the first cell that differs from the physical layout of the first master cell.

31. A method according to claim 27, wherein the determining the result, for a first cell of the first plurality of the cells and a first master cell of the plural master cells, includes a layout versus layout comparison of the first cell and the first master cell.

32. A method according to claim 27, wherein the data corresponding to the physical layouts of the plural cells of the integrated circuit design includes data representing coordinates of at least one polygon making up the physical layout of each of the cells of the plural cells.

33. A method according to claim 32, wherein the data corresponding to the physical layouts of the plural master cells includes data representing coordinates of at least one polygon making up the physical layout of each of the plural master cells.

34. A method according to claim 33, wherein determining the result, for a first cell of the first plurality of the cells and a first master cell of the plural master cells, includes a comparison of coordinates in the physical layout of the first cell with coordinates in the physical layout of the first master cell.

35. A method according to claim 34, wherein the comparison determines if the coordinates match.

36. A method according to claim 35, wherein the comparison includes an XOR comparison of coordinates.

37. A method according to claim 27, wherein the determining the result, for a first cell of the first plurality of the cells and a first master cell of the plural master cells, includes an XOR comparison of plural features of the physical layout of the first cell with corresponding plural features of the physical layout of the first master cell.

38. A method according to claim 27, wherein the data corresponding to the physical layout of a cell of the first plurality of cells, and the data corresponding to the physical layout of a master cell of the plural master cells, are in a GDS-II format.

39. A method according to claim 27, further comprising:
generating an output that indicates a difference has been detected when the result, for a first cell of the first plurality of the cells and a first master cell of the plural master cells, indicates that the physical layout of the first cell does not correspond to the physical layout of the first master cell.

40. A method according to claim 39, wherein the output includes: (a) identification of the first cell having a layout that differs from the first master cell, and (b) identification of a location where the physical layout of the first cell differs from the physical layout of the first master cell.

41. A method according to claim 40, wherein the output includes a GDS-II file that contains data identifying one or more portions of the physical layout of the first cell that differs from the physical layout of the first master cell.

42. A method according to claim 39, wherein the output includes a file that identifies the determined differences between the physical layout of the first cell as compared to the physical layout of the first master cell.

43. A computer program embodied in a computer readable medium, the computer readable medium embodying the computer program with computer-readable devices, the computer program comprising:
computer readable program code for receiving input including data corresponding to an integrated circuit design that contains physical layouts of plural cells;
computer readable program code for receiving input including data corresponding to physical layouts of plural master cells;
computer readable program code to accomplish, for a first plurality of the plural cells of the integrated circuit design, determining for each a result that indicates if each of the first plurality of the cells has a physical layout that corresponds to a physical layout of one of the master cells;

computer readable program code for determining, with the result for each of the first plurality of the cells, when to apply a design rule to each of the first plurality of cells; and computer readable program code for generating a first output indicative of an application of at least one design rule to the integrated circuit design.

44. A system, comprising:
a sub-system that receives input data corresponding to an integrated circuit design that contains a physical layout of a cell;
a sub-system that receives input data corresponding to a physical layout of a master cell;
a sub-system that determines a result that indicates if the physical layout of the cell corresponds to the physical layout of the master cell;
a sub-system that determines, with the result, when to apply a first design rule to the cell; and
a sub-system that generates a first output indicative of an application of at least one design rule to the integrated circuit design.

45. A system according to claim 44, further comprising:
a sub-system that determines if the cell potentially corresponds to the master cell; and
a sub-system that determines the result when the cell is determined to potentially correspond to the master cell.

46. A system according to claim 44, wherein the result is output as a file that identifies determined differences, if any, between the physical layout of the cell as compared to the physical layout of the master cell.

47. A system according to claim 46, wherein the file contains data identifying one or more portions of the physical layout of the cell that differs from the physical layout of the master cell.

48. A system according to claim 45, wherein the sub-system that determines potential correspondence comprises:
a sub-system that determines a probability of the cell corresponding to the master cell; and
a sub-system that determines there is a potential correspondence when the probability is sufficient.

49. A system according to claim 48, wherein sufficient probability is any probability.

50. A system according to claim 48, wherein the probability is determined with a test that uses a count of a number of polygons in the cell and a count of a number of polygons master cell.

51. A system according to claim 48, wherein the probability is determined with a test that determines if a first polygon is present in the cell and a second polygon is present in the master cell.

52. A system according to claim 48, wherein the probability is determined with a test that determines if a first polygon is present in the cell at a first location and a second polygon is present in the master cell at a second location.

53. A system according to claim 48, wherein the probability is determined with a test that determines if a first number of layers is present in the cell at a first location and a second number of layers is present in the master cell at a second location.

54. A system according to claim 44, wherein the sub-system that determines the result accomplishes the determination, at least in part, by making a layout versus layout comparison of the cell and the master cell.

55. A system according to claim 44, wherein the input data corresponding to the physical layout of the cell includes data representing coordinates of at least one polygon making up the physical layout of the cell.

56. A system according to claim 55, wherein the input data corresponding to the physical layout of the master cell includes data representing coordinates of at least one polygon making up the physical layout of the master cell.

57. A system according to claim 56, wherein the sub-system that determines the result accomplishes the determination, at least in part, by a comparison of coordinates in the physical layout of the cell with coordinates in the physical layout of the master cell.

58. A system according to claim 57, wherein the comparison is accomplished to determine if the coordinates match one another.

59. A system according to claim 58, wherein the comparison is accomplished using an XOR comparison procedure.

60. A system according to claim 44, wherein the sub-system that determines the result accomplishes the determination, at least in part, using an XOR comparison of plural features of the physical layout of the cell with corresponding plural features of the physical layout of the master cell.

61. A system according to claim 44, wherein the input data corresponding to the physical layout of the cell and the input data corresponding to the physical layout of the master cell are in a GDS-II format.

62. A system according to claim 44, further comprising:
a sub-system that generates an output that indicates a difference has been detected when it is determined that the physical layout of the cell differs from the physical layout of the master cell.

63. A system according to claim 62, wherein the output indicates a location where the physical layout of the cell differs from the physical layout of the master cell.

64. A system according to claim 63, wherein the output includes a GDS-II file that contains data identifying one or more portions of the physical layout of the cell that differs from the physical layout of the master cell.

65. A system according to claim 62, wherein the output includes a file that identifies the difference between the physical layout of the cell as compared to the physical layout of the master cell.

66. A system according to claim 44, further comprising:
a sub-system that applies the first design rule to the cell when the result indicates that the physical layout of the cell does not correspond to the physical layout of the master cell.

67. A system according to claim 66, further comprising:
a sub-system that applies a second design rule to the cell when the result indicates that the physical layout of the cell does correspond to the physical layout of the master cell.

68. A system according to claim 44, further comprising:
a sub-system that applies the first design rule to the cell when the result indicates that the physical layout of the cell does correspond to the physical layout of the master cell.

69. A system, comprising:
a sub-system that receives input including data corresponding to an integrated circuit design that contains physical layouts of plural cells;
a sub-system that receives input including data corresponding to physical layouts of plural master cells;
a sub-system that, for each of a first plurality of the plural cells of the integrated circuit design, determines a result that indicates if the cell has a physical layout that corresponds to a physical layout of one of the master cells;

a sub-system that determines, with each result, when to apply a design rule to each of the first plurality of cells; and a sub-system that generates a first output indicative of an application of at least one design rule to the integrated circuit design.

70. A system according to claim 69, further comprising:
a sub-system that determines if a first cell, of the first plurality of the cells, potentially corresponds to a first master cell of the plural master cells; and
a sub-system that determines the result, for the first cell, when the first cell is determined to potentially correspond to the first master cell.

71. A system according to claim 70, wherein the sub-system that determines the result, for the first cell, outputs a file that includes identification of determined differences between the physical layout of the first cell as compared to the physical layout of the first master cell.

72. A system according to claim 71, wherein the file contains data identifying one or more portions of the physical layout of the first cell that differs from the physical layout of the first master cell.

73. A system according to claim 69, wherein the sub-system that determines the result, for a first cell of the first plurality of the cells and a first master cell of the plural master cells, accomplishes the determination, at least in part, by making a layout versus layout comparison of the first cell and the first master cell.

74. A system according to claim 69, wherein the data corresponding to the physical layouts of the plural cells of the integrated circuit design includes data representing coordinates of at least one polygon making up the physical layout of each of the cells of the plural cells.

75. A system according to claim 74, wherein the input data corresponding to the physical layouts of the plural master cells includes data representing coordinates of at least one polygon making up the physical layout of each of the plural master cells.

76. A system according to claim 75, wherein the sub-system that determines the result, for a first cell of the first plurality of the cells and a first master cell of the plural master cells, accomplishes the determination, at least in part, by a comparison of coordinates in the physical layout of the first cell with coordinates in the physical layout of the first master cell.

77. A system according to claim 76, wherein the comparison determines if the coordinates.

78. A system according to claim 77, wherein the comparison includes an XOR comparison procedure.

79. A system according to claim 69, wherein the sub-system that determines the result, for a first cell of the first plurality of cells and a first master cell of the plural master cells, determines if the physical layout of the first cell corresponds to the physical layout of the first master cell, at least in part, using an XOR comparison of plural features of the physical layout of the first cell with corresponding plural features of the physical layout of the first master cell.

80. A system according to claim 69, wherein the input data corresponding to the physical layout of a cell of the first plurality of cells, and the input data corresponding to the physical layout of a master cell of the plural master cells, are in a GDS-II format.

81. A system according to claim 69, further comprising:
a sub-system that generates an output that indicates a difference has been detected when the result, for a first cell of the first plurality of the cells and a first master cell of the plural master cells, indicates that the physical layout of the first cell does not correspond to the physical layout of the first master cell.

82. A system according to claim 81, wherein the output includes: (a) identification of the first cell having a layout that differs from the first master cell, and (b) identification of a location where the physical layout of the first cell differs from the physical layout of the first master cell.

83. A system according to claim 82, wherein the output includes a GDS-II file that contains data identifying one or more portions of the physical layout of the first cell that differs from the physical layout of the first master cell.

84. A system according to claim 81, wherein the output includes a file that identifies the determined differences between the physical layout of the first cell as compared to the physical layout of the first master cell.

* * * * *